US009755034B2

United States Patent
Kim et al.

(10) Patent No.: US 9,755,034 B2
(45) Date of Patent: Sep. 5, 2017

(54) SEMICONDUCTOR DEVICE HAVING NANOWIRE

(71) Applicant: SAMSUNG ELECTRONICS CO., LTD., Suwon-si, Gyeonggi-Do (KR)

(72) Inventors: Dong-Kwon Kim, Gimcheon-si (KR); Kang-Il Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 50 days.

(21) Appl. No.: 14/923,982

(22) Filed: Oct. 27, 2015

(65) Prior Publication Data

US 2017/0117375 A1    Apr. 27, 2017

(51) Int. Cl.
*H01L 29/76* (2006.01)
*H01L 29/423* (2006.01)
*H01L 29/78* (2006.01)
*H01L 29/06* (2006.01)

(52) U.S. Cl.
CPC .... *H01L 29/42392* (2013.01); *H01L 29/0673* (2013.01); *H01L 29/785* (2013.01)

(58) Field of Classification Search
CPC ........... H01L 29/0673; H01L 29/42392; H01L 29/785
USPC ................................................. 257/330, 346
See application file for complete search history.

(56) References Cited

U.S. PATENT DOCUMENTS

| 7,892,945 | B2 | 2/2011 | Bedell et al. |
| 7,902,575 | B2 | 3/2011 | Ernst et al. |
| 8,022,439 | B2 | 9/2011 | Kajiyama |
| 8,785,909 | B2 | 7/2014 | Radosavljevic et al. |
| 8,796,742 | B1 | 8/2014 | Chang et al. |
| 8,969,149 | B2 | 3/2015 | Leobandung |
| 2010/0193770 | A1* | 8/2010 | Bangsaruntip ......... B82Y 10/00 257/24 |
| 2011/0133169 | A1* | 6/2011 | Bangsaruntip ......... B82Y 10/00 257/38 |
| 2014/0001441 | A1 | 1/2014 | Kim et al. |
| 2014/0151639 | A1 | 6/2014 | Chang et al. |
| 2014/0264280 | A1 | 9/2014 | Kim et al. |
| 2015/0064891 | A1 | 3/2015 | Cheng et al. |

FOREIGN PATENT DOCUMENTS

| JP | 2005-079517 | 3/2005 |
| JP | 2010-129974 | 6/2010 |

* cited by examiner

*Primary Examiner* — Hung Vu
(74) *Attorney, Agent, or Firm* — F. Chau & Associates, LLC

(57) ABSTRACT

A semiconductor device is provided as follows. A first nanowire is disposed on a substrate. The first nanowire is extended in a first direction and spaced apart from the substrate. A gate electrode surrounds a periphery of the first nanowire. The gate electrode is extended in a second direction intersecting the first direction. A gate spacer is formed on a sidewall of the gate electrode. The gate spacer includes an inner sidewall and an outer sidewall facing each other. The inner sidewall of the gate spacer faces the sidewall of the gate electrode. An end portion of the first nanowire is protruded from the outer sidewall of the gate spacer. A source/drain epitaxial layer is disposed on at least one side of the gate electrode. The source/drain is connected to the protruded end portion of the first nanowire.

18 Claims, 18 Drawing Sheets

[FIG 01]
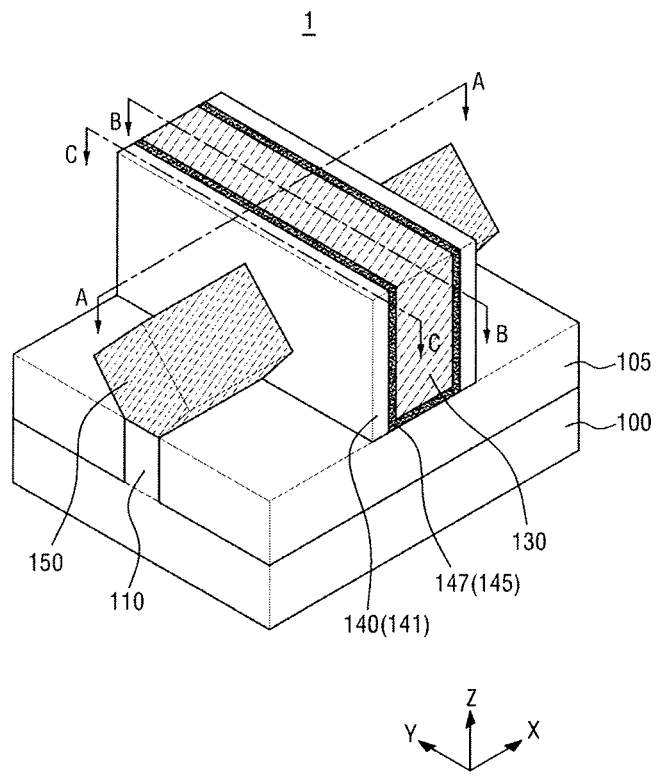
[FIG 02]
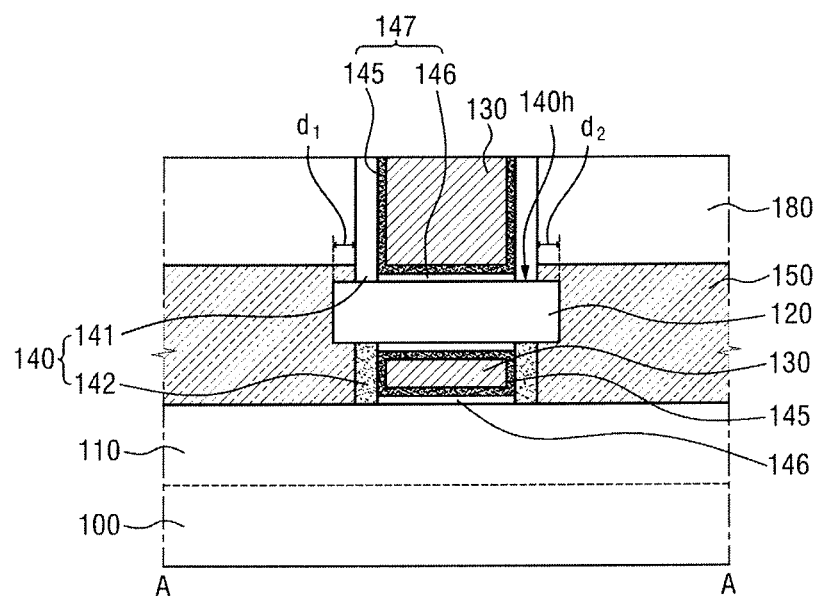

[FIG 03]
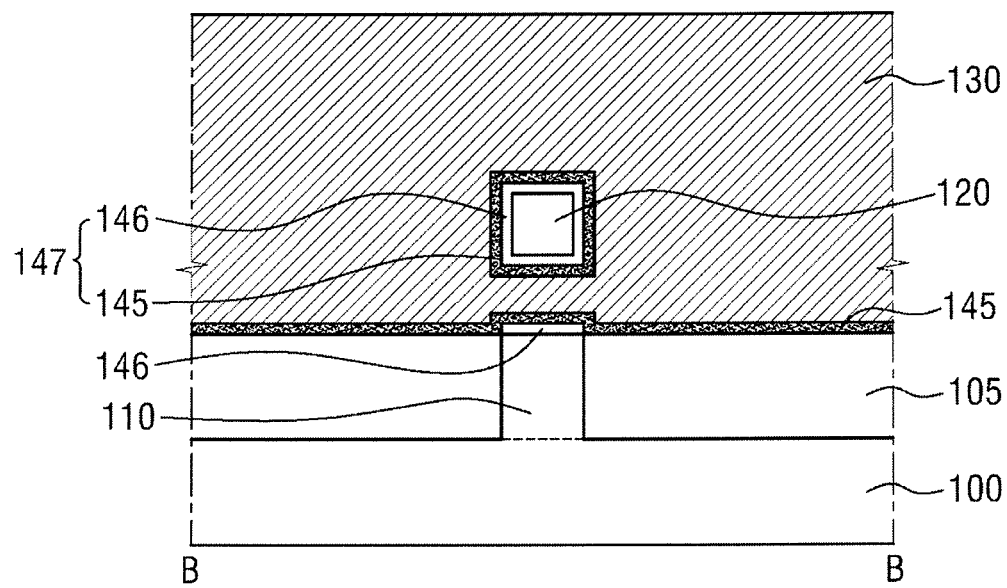
[FIG 04]
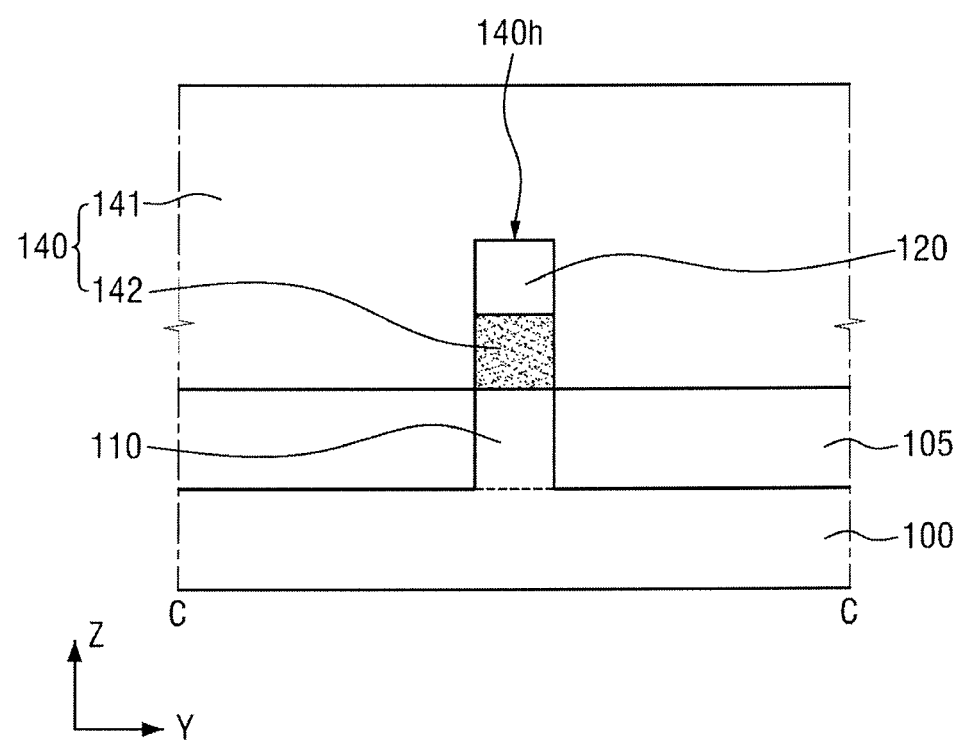

[FIG 05]
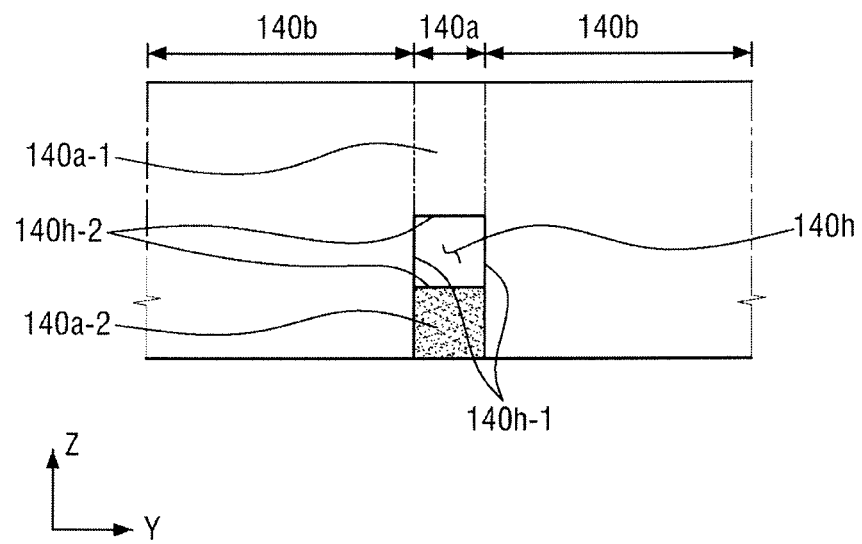
[FIG 06]
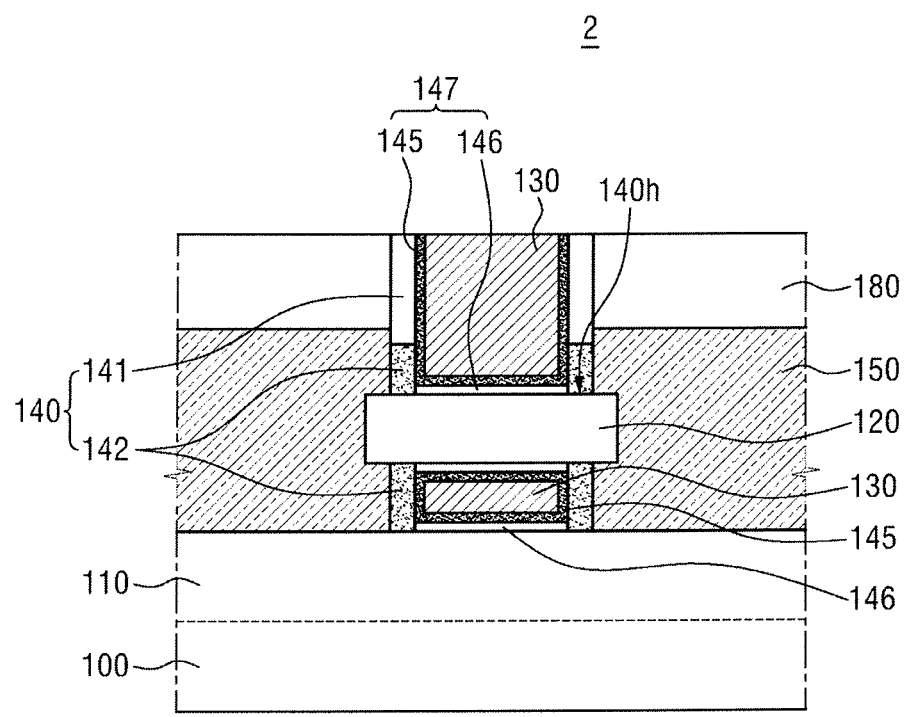

[FIG 07]
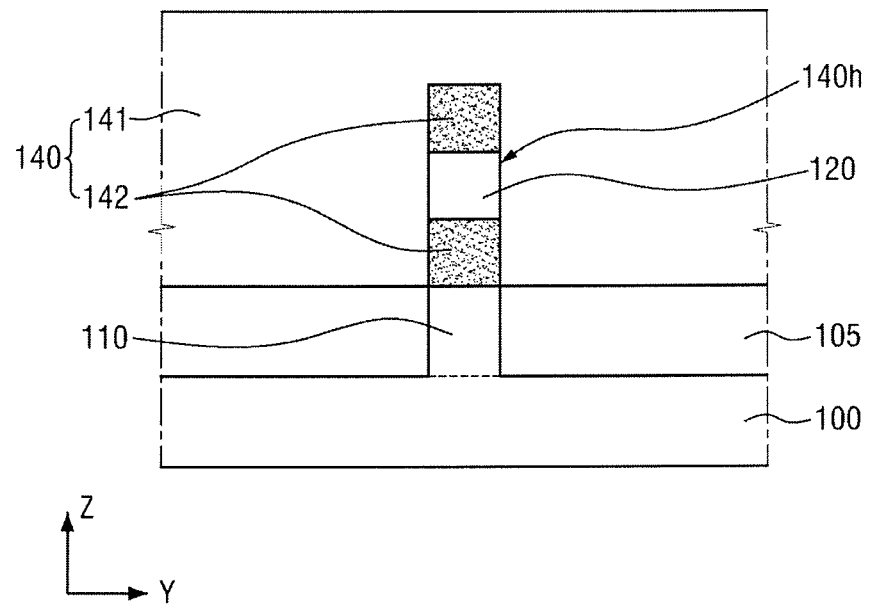
[FIG 08]
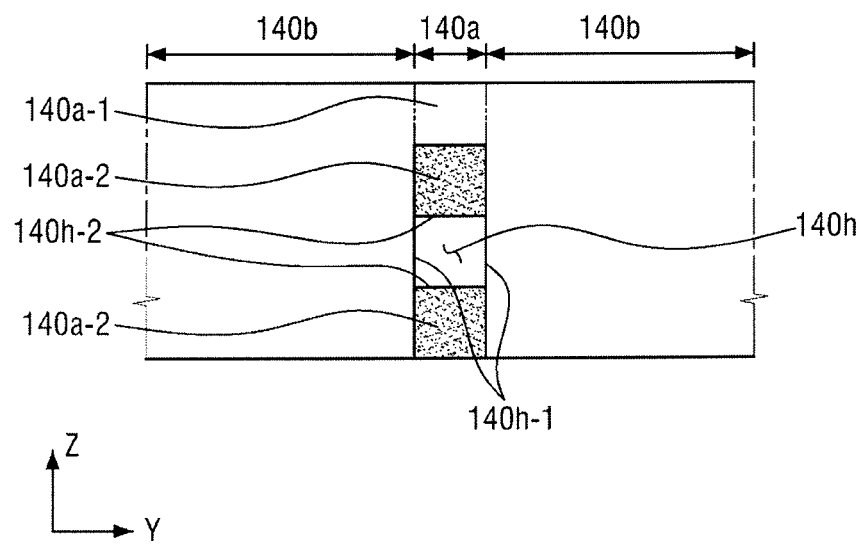

[FIG 09]
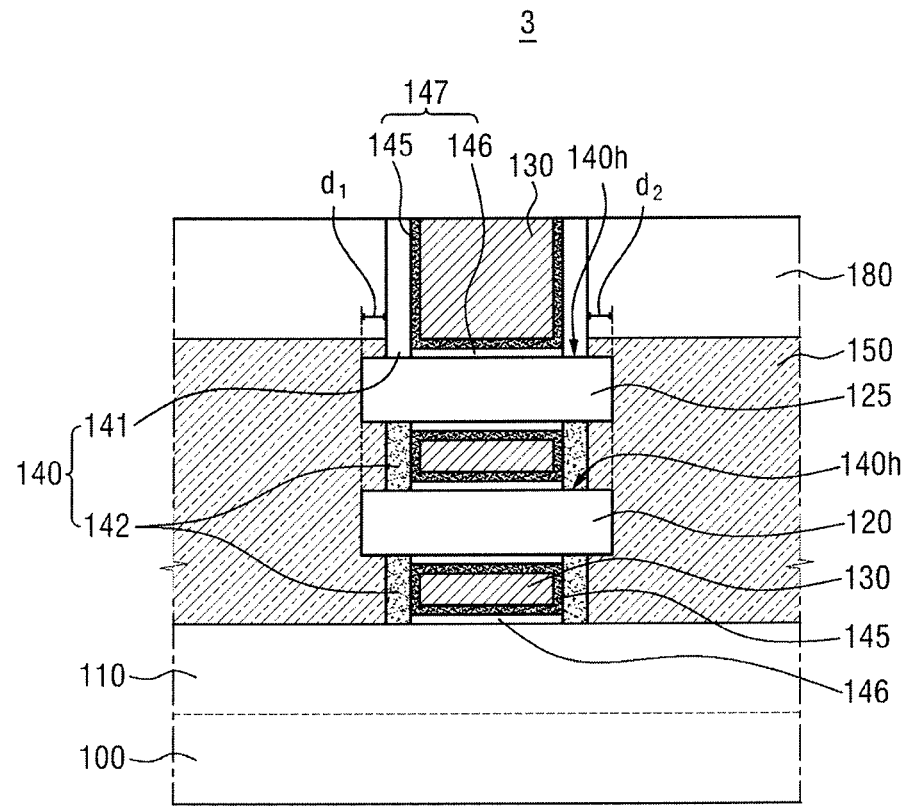
[FIG 10]
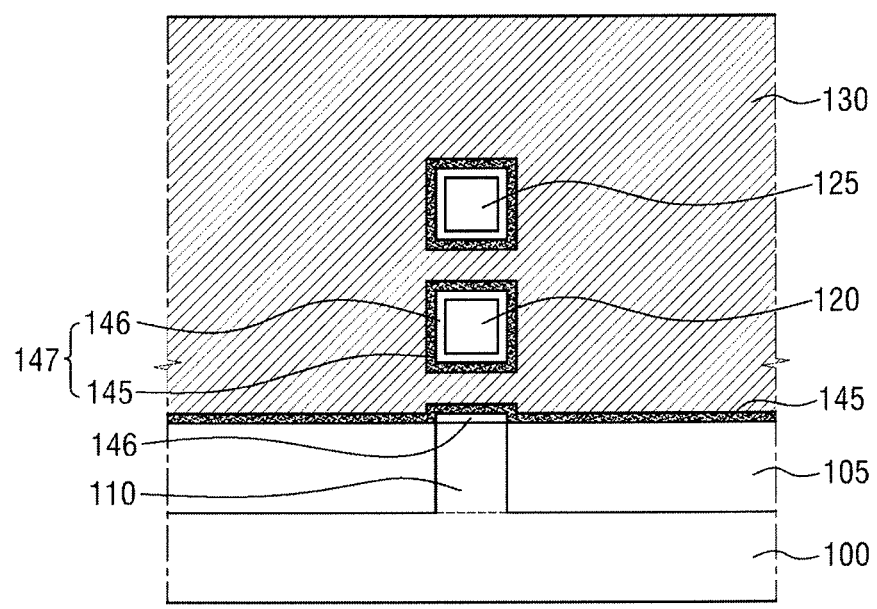

[FIG 11]
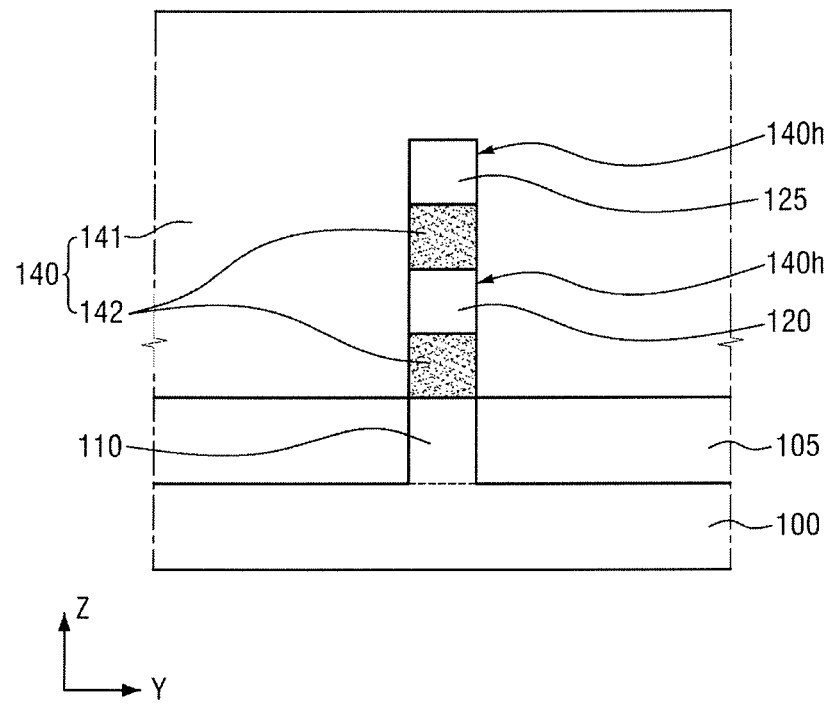
[FIG 12]
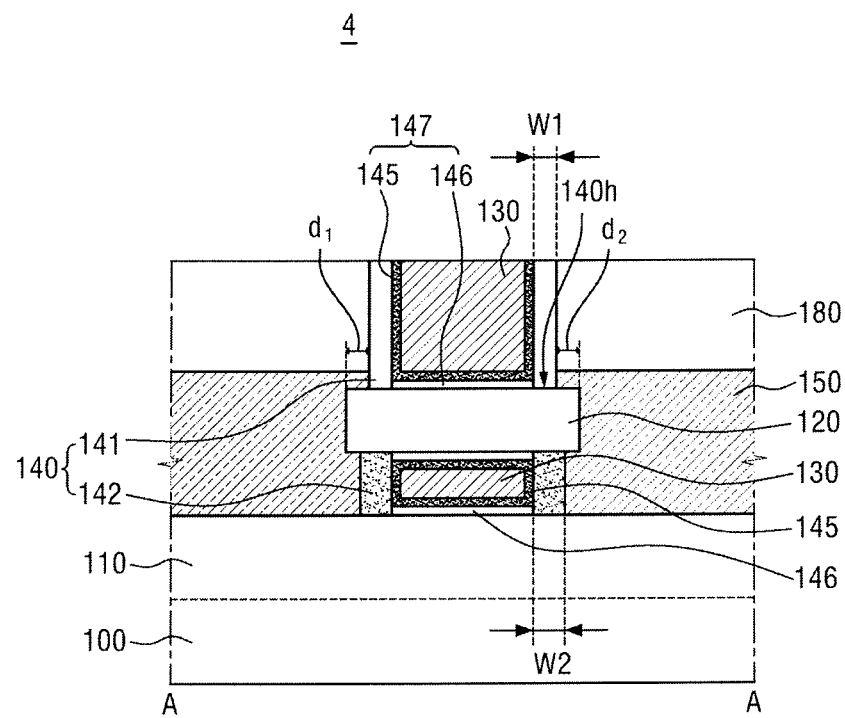

[FIG 13]
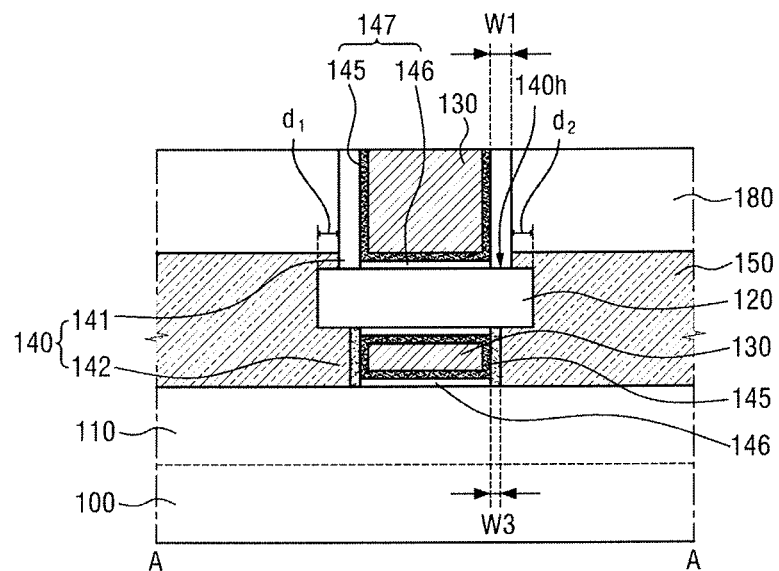
[FIG 14]
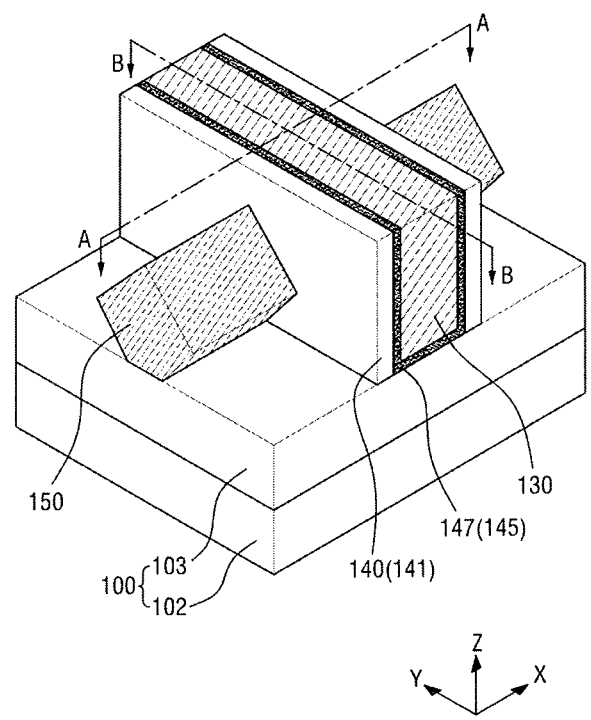

[FIG 15]
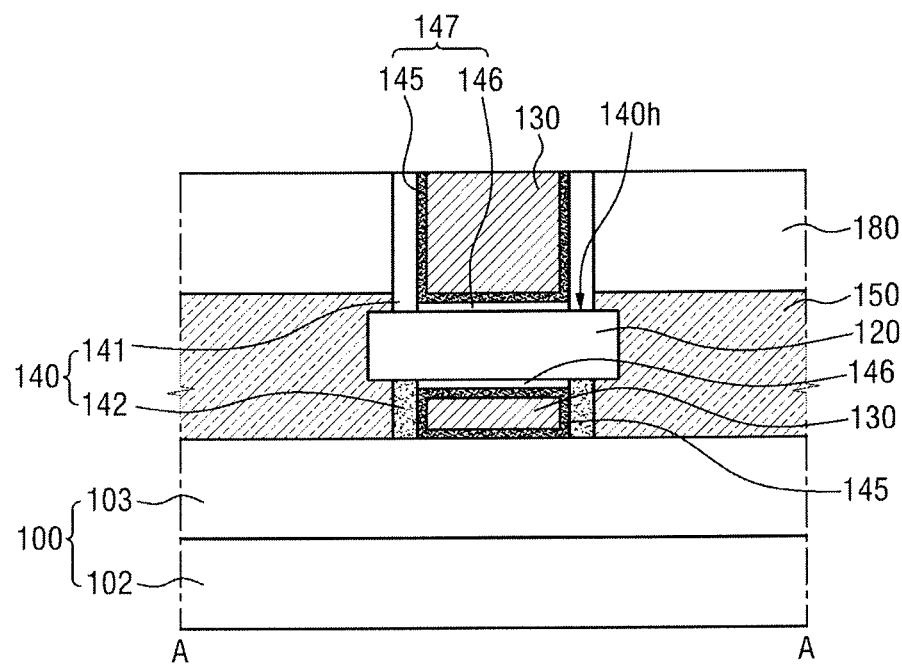
[FIG 16]
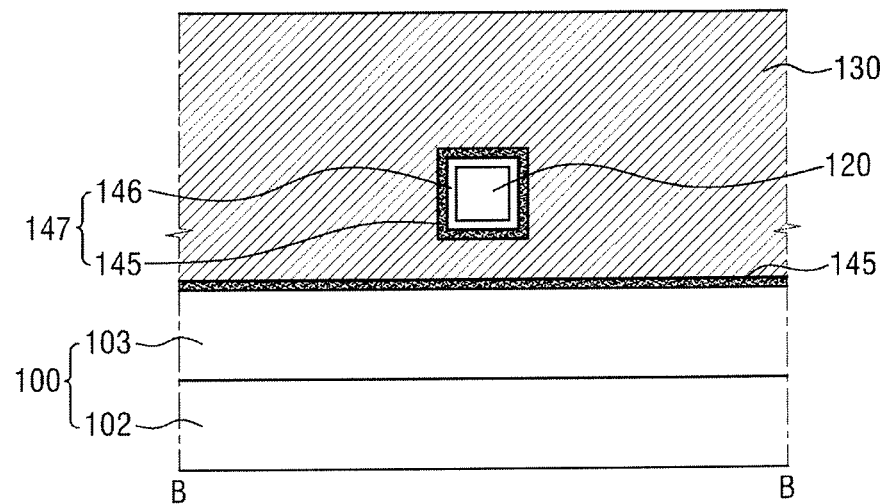

[FIG 17]
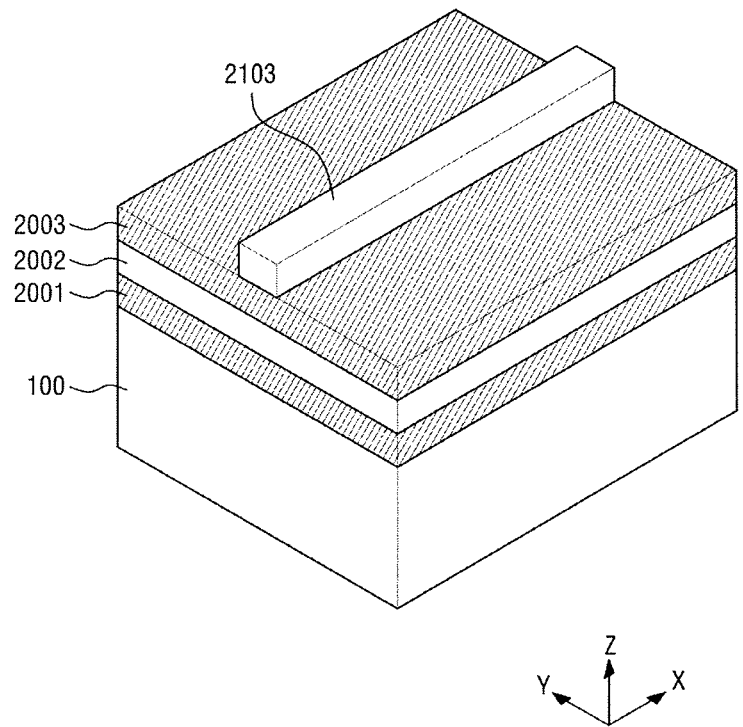
[FIG 18]
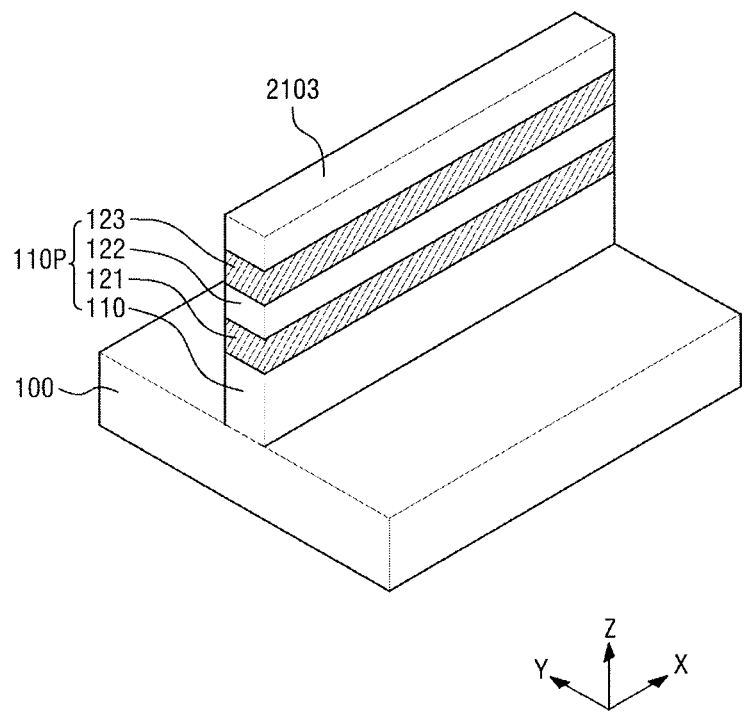

[FIG 19]
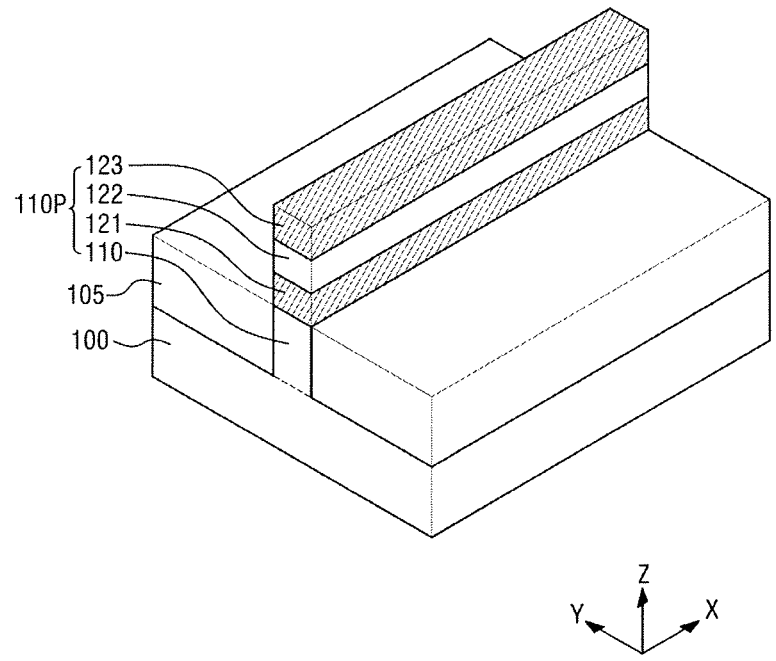
[FIG 20]
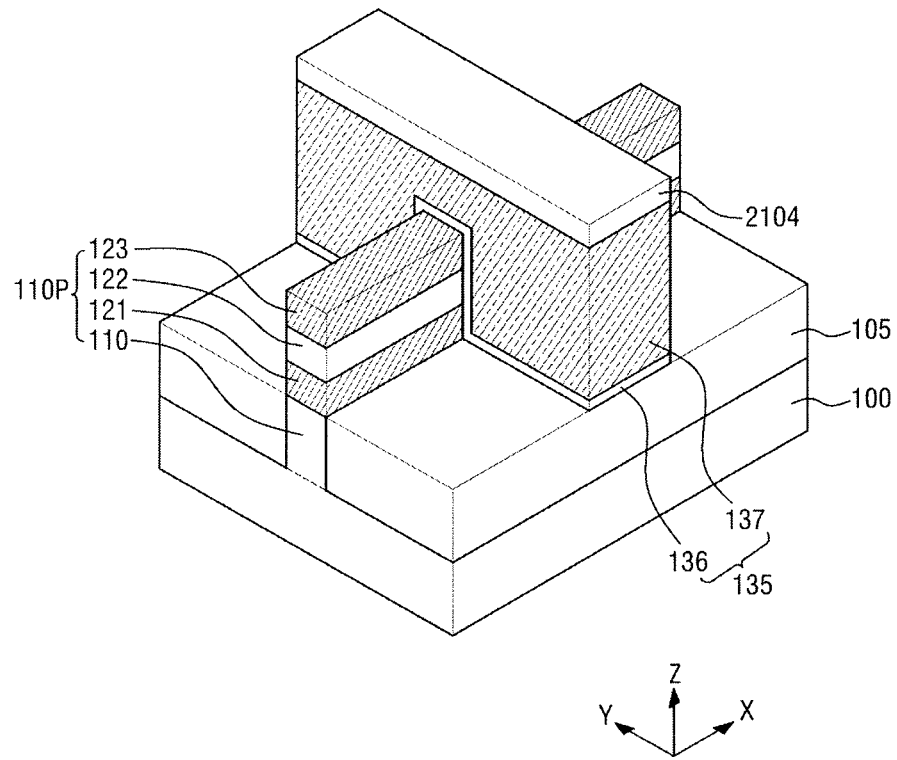

[FIG 21]
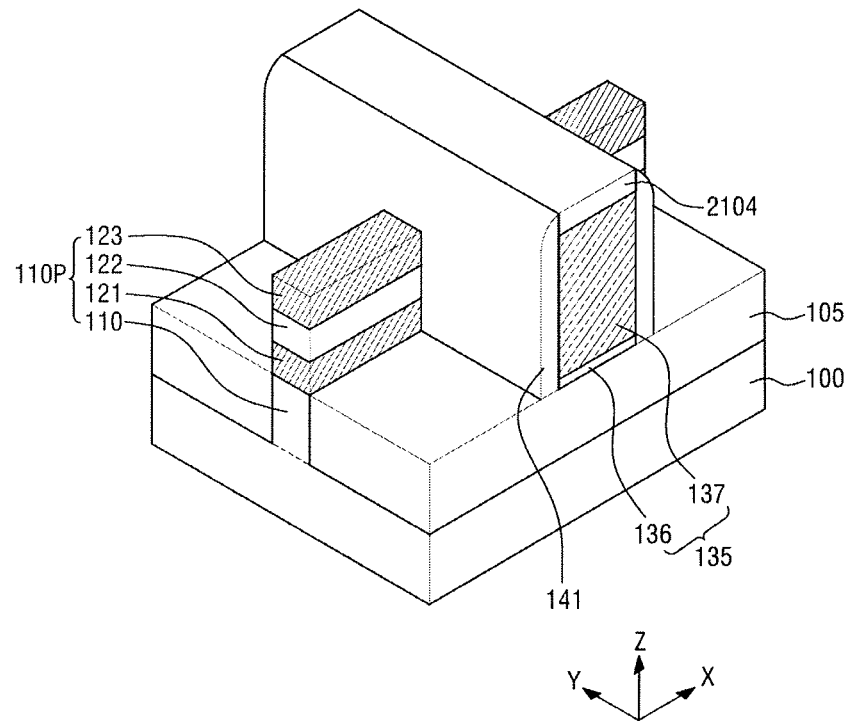
[FIG 22]
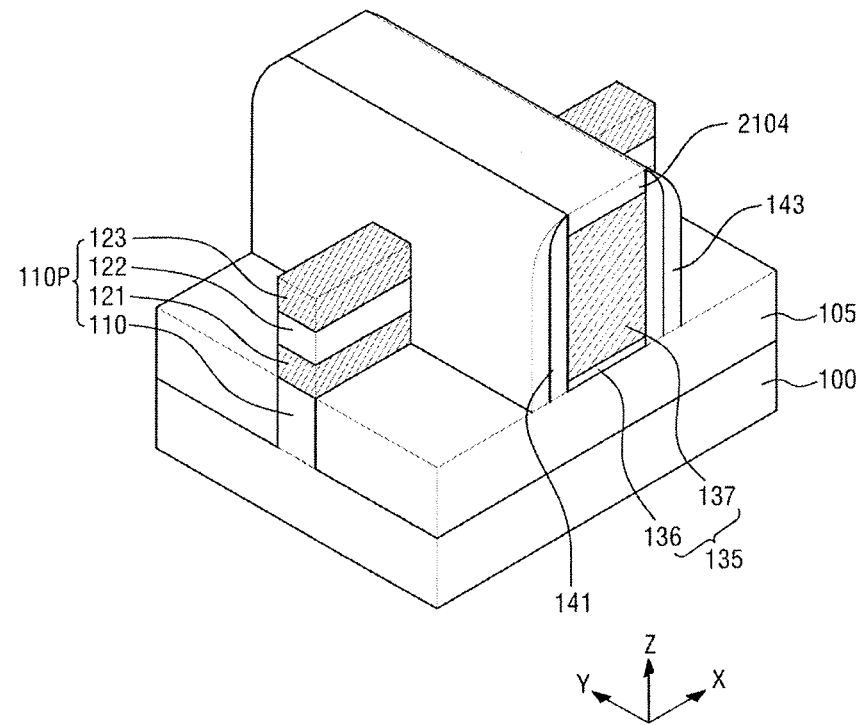

[FIG 23]
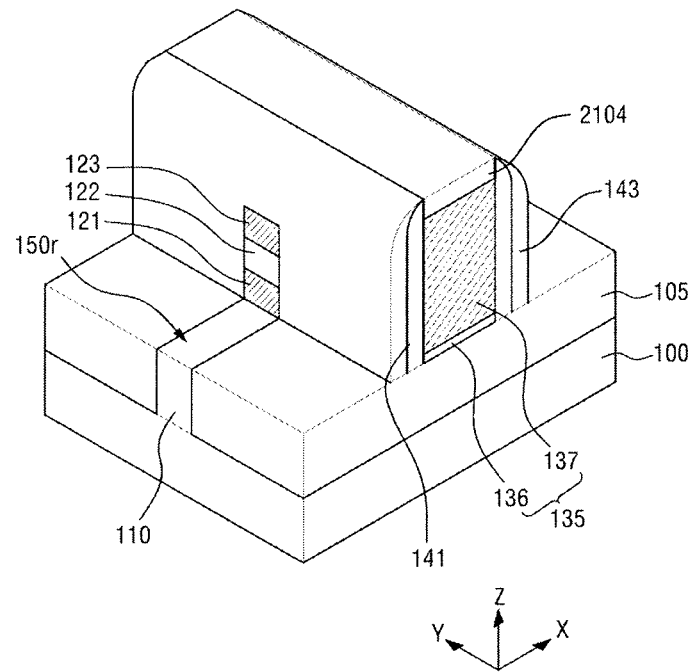
[FIG 24]
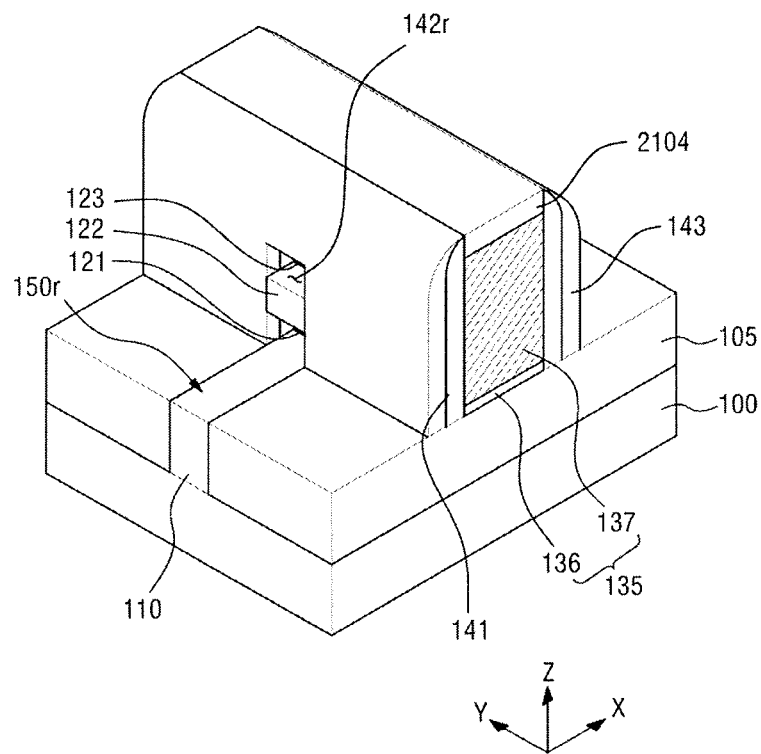

[FIG 25]
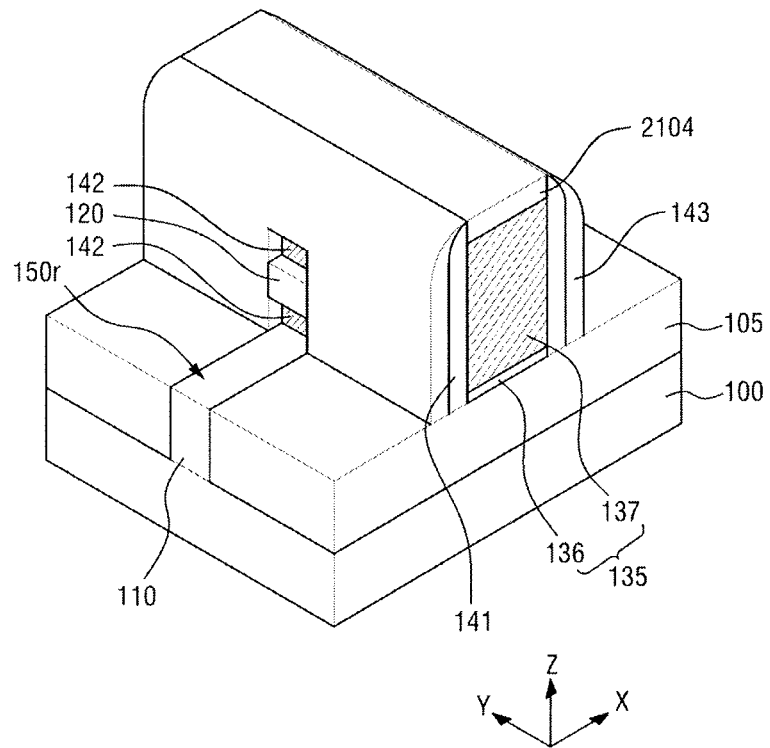
[FIG 26]
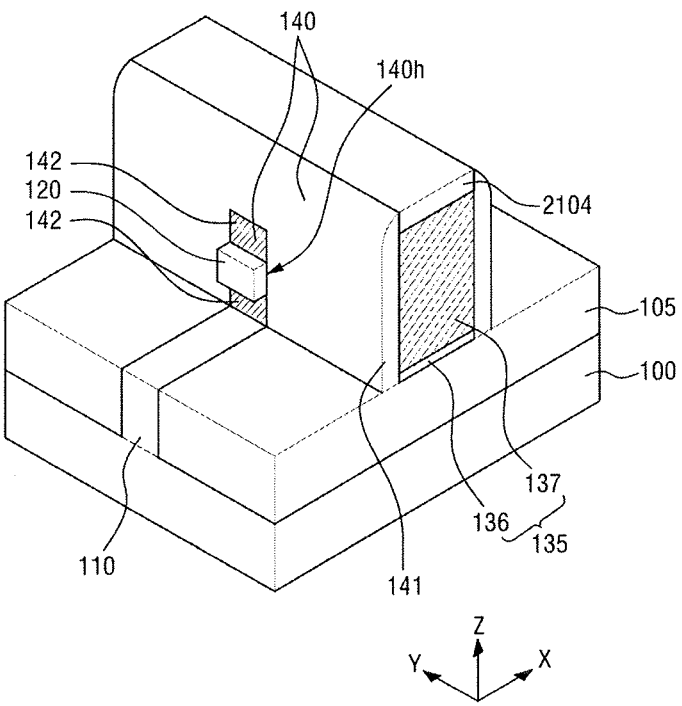

[FIG 27]
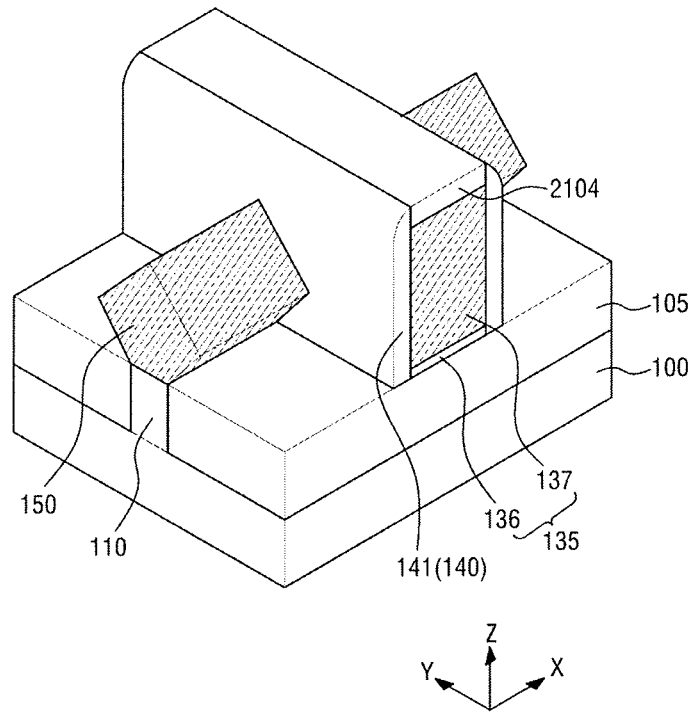
[FIG 28]
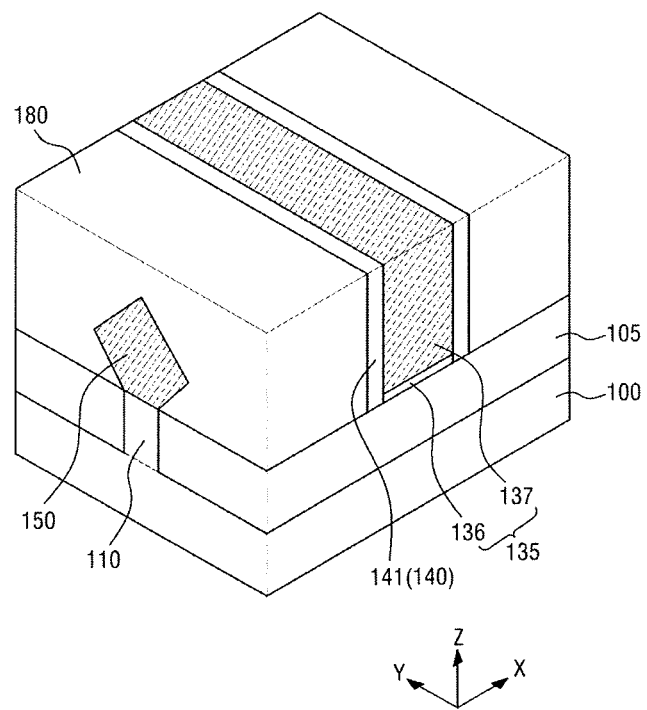

[FIG 29]
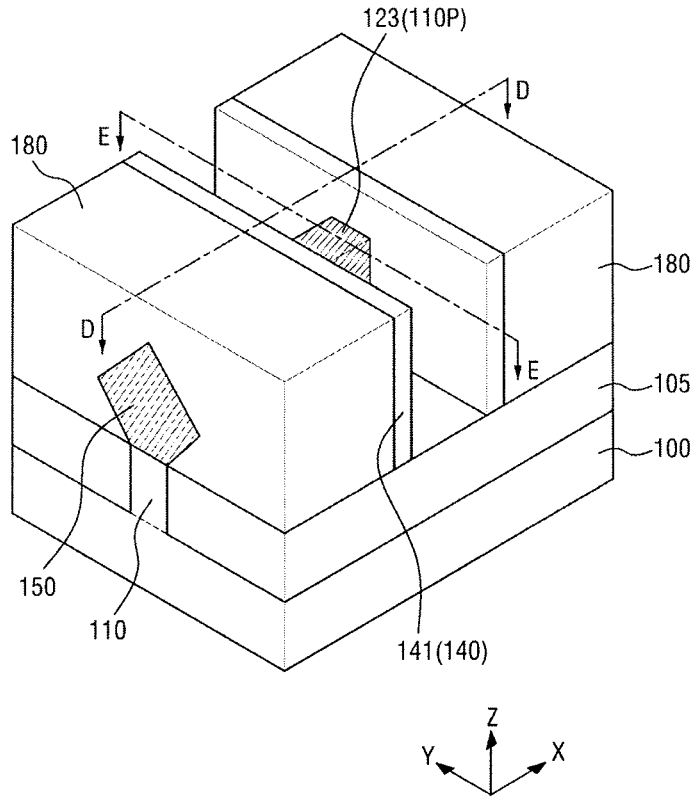
[FIG 30]
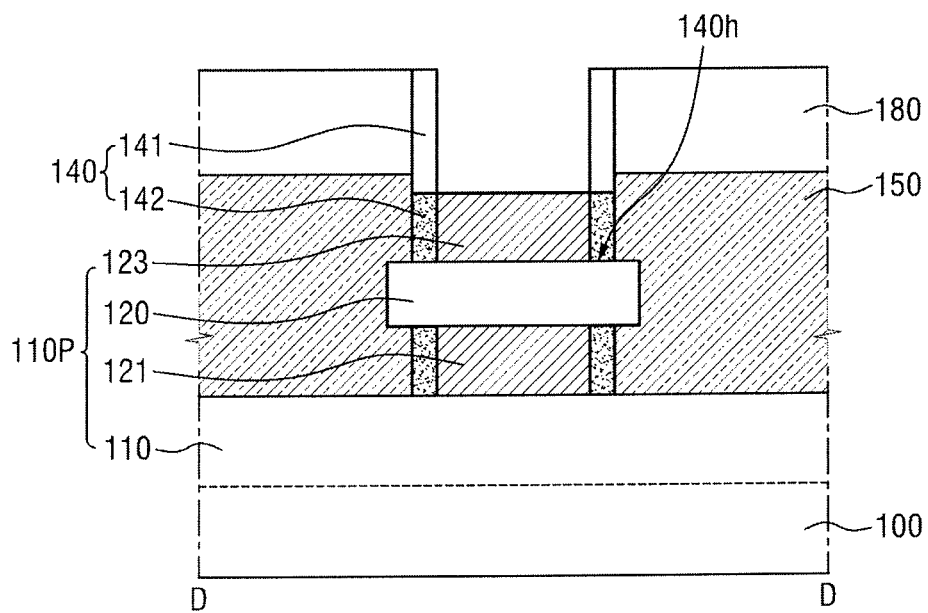

[FIG 31]
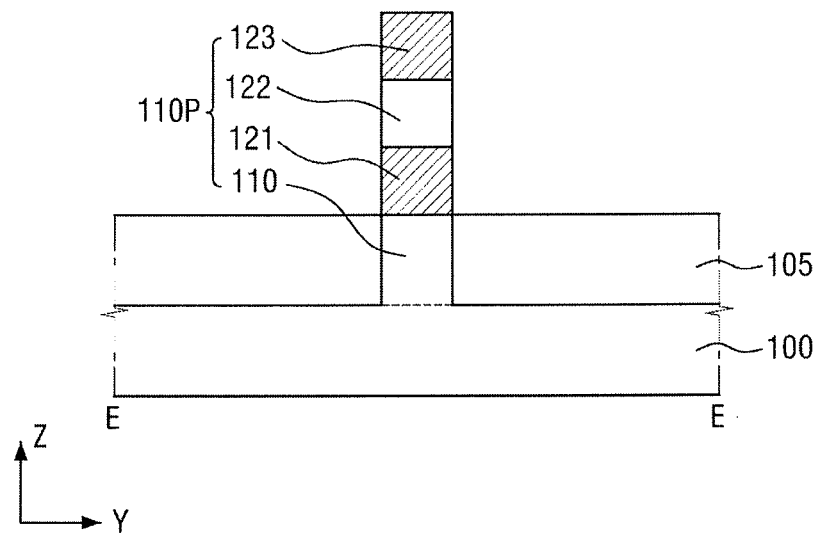
[FIG 32]
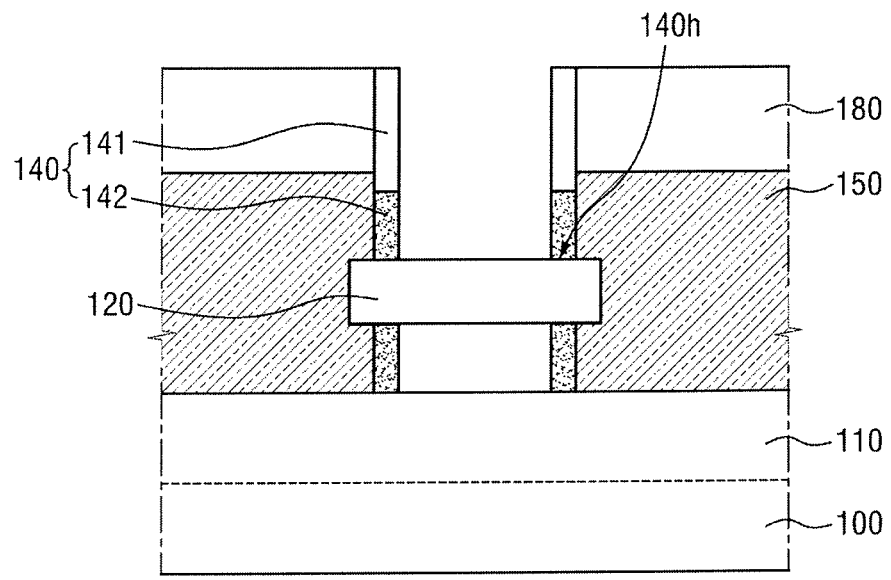

[FIG 33]
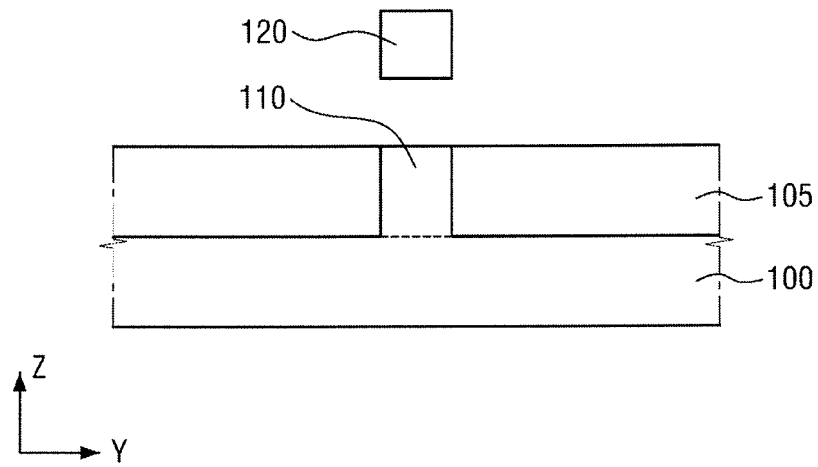
[FIG 34]
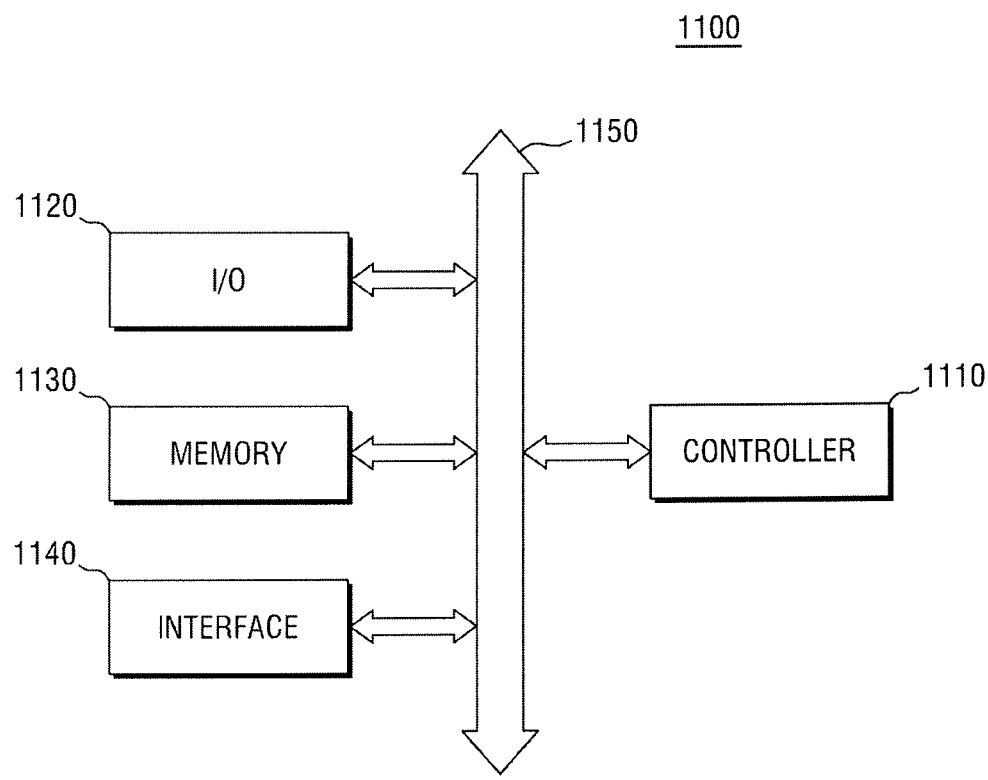

[FIG 35]
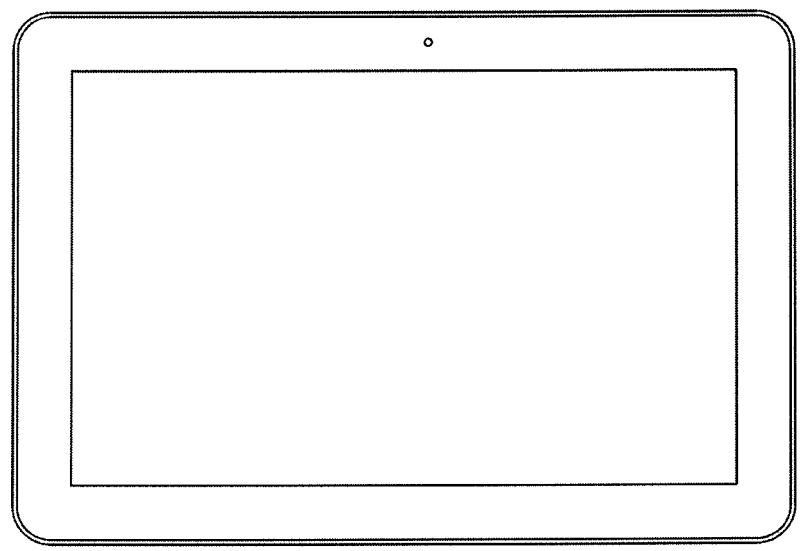
[FIG 36]
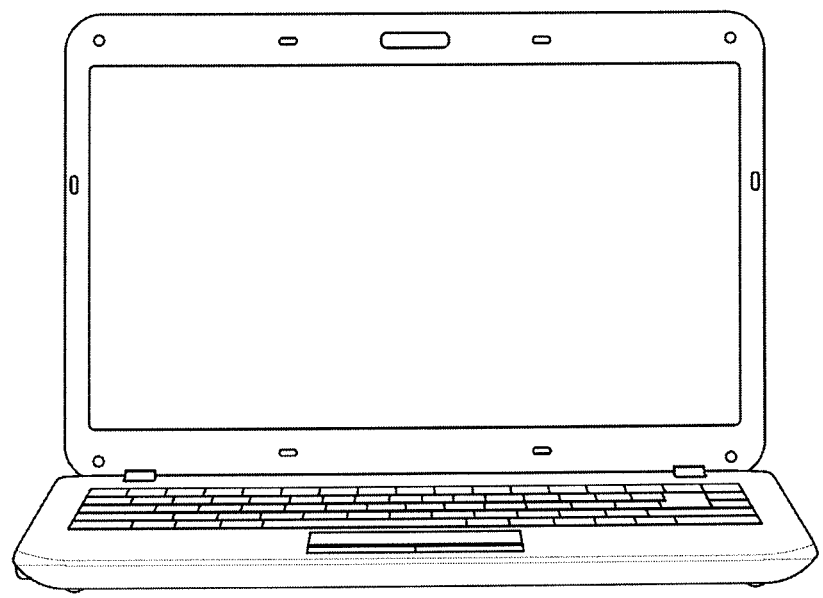

SEMICONDUCTOR DEVICE HAVING NANOWIRE

TECHNICAL FIELD

The present inventive concept relates to a semiconductor device and a method of fabricating the same.

DISCUSSION OF RELATED ART

Multigate transistor has been suggested to scale down transistors in size using three-dimensional channels. Current control capability may increase without increasing gate lengths of the multigate transistors. Furthermore, short channel effects (SCE) may be reduced.

SUMMARY

According to an exemplary embodiment of the present inventive concept, a semiconductor device is provided as follows. A first nanowire is disposed on a substrate. The first nanowire is extended in a first direction and spaced apart from the substrate. A gate electrode surrounds a periphery of the first nanowire. The gate electrode is extended in a second direction intersecting the first direction. A gate spacer is formed on a sidewall of the gate electrode. The gate spacer includes an inner sidewall and an outer sidewall facing each other. The inner sidewall of the gate spacer faces the sidewall of the gate electrode. An end portion of the first nanowire is protruded from the outer sidewall of the gate spacer. A source/drain epitaxial layer is disposed on at least one side of the gate electrode. The source/drain is connected to the protruded end portion of the first nanowire.

According to an exemplary embodiment of the present inventive concept, a semiconductor device is provided as follows. A gate electrode is disposed on a substrate and extended in a first direction. An inner spacer is formed on the substrate and a first portion of a sidewall of the gate electrode. An outer spacer is formed on a second portion of the sidewall of the gate electrode. The second portion of the sidewall of the gate electrode surrounds the first portion of the sidewall of the gate electrode. A first nanowire is disposed on the substrate. The first nanowire is extended in a second direction different from the first direction, and an end portion of the first nanowire is protruded from the inner spacer and the outer spacer. A source/drain is connected with the end portion of the first nanowire.

According to an exemplary embodiment of the present inventive concept, a semiconductor device is provided as follows. A first nanowire is extended in a first direction and disposed on a substrate. The first nanowire is spaced apart from the substrate. A gate electrode is extended in a second direction intersecting the first direction. The gate electrode surrounds a periphery of a portion of the first nanowire to expose an end portion of the first nanowire. A source/drain is disposed on at least one side of the gate electrode. The source/drain covers the end portion of the first nanowire.

According to an exemplary embodiment of the present inventive concept, a semiconductor device is provided as follows. A gate structure includes a gate electrode extending in a first direction on a substrate, and a gate spacer formed on a sidewall of the gate electrode. A first nanowire extends in a second direction intersecting the first direction, and passes through the gate structure. A width of the first nanowire is greater than a width of the gate structure. The widths of the first nanowire and the gate structure are measured along the second direction.

According to an exemplary embodiment of the present inventive concept, a method of manufacturing a semiconductor device is provided as follows. A fin-type structure is formed on a substrate and extended in a first direction. The fin-type structure includes a fin-type pattern, a first semiconductor pattern, a pre-nanowire and a second semiconductor pattern stacked vertically in the listed order. A dummy gate electrode is formed on the fin-type structure. The dummy gate electrode intersects the fin-type structure and extends in a second direction different from the first direction. A first spacer is formed on a sidewall of the dummy gate electrode. A second spacer is formed on a sidewall of the first spacer. A portion of the fin-type structure is removed to expose the fin-type pattern and form a first nanowire patterned from the pre-nanowire. The portion of the fin-type structure is not overlapped with the dummy gate electrode and the first and the second gate spacers. A dimple is formed by removing a portion of the second semiconductor pattern overlapped with the first and the second gate spacers and by removing a portion of the first semiconductor pattern overlapped with the first and the second gate spacers. The first nanowire remains in the dimple. An inner spacer layer fills the dimple, covering the first nanowire. An inner spacer is formed in the dimple by removing the second spacer and a portion of the inner spacer layer. The first nanowire is exposed and protruded from the inner spacer. A source/drain is formed on the exposed fin-type pattern. The source/drain covers the exposed first nanowire.

According to an exemplary embodiment of the present inventive concept, a method of manufacturing a semiconductor device is provided as follows. A fin-type pattern protruding from a substrate and extending in a first direction is formed. A nanowire is formed to be spaced apart from an upper surface of the fin-type pattern and be extended in the first direction. A dummy gate line is formed on a portion of the nanowire and extended in a second direction crossing the first direction. The dummy gate line surrounds the portion of the nanowire to form an protruded nanowire from the dummy gate line. A source/drain is epitaxially formed from the protruded nanowire.

BRIEF DESCRIPTION OF THE DRAWINGS

These and other features of the inventive concept will become more apparent by describing in detail exemplary embodiments thereof with reference to the accompanying drawings of which:

FIG. 1 is a perspective view of a semiconductor device according to an exemplary embodiment of the present inventive concept;

FIG. 2 is a cross sectional view taken along line A-A of FIG. 1;

FIG. 3 is a cross sectional view taken along line B-B of FIG. 1;

FIG. 4 is a cross sectional view taken along line C-C of FIG. 1;

FIG. 5 illustrates only the gate spacer of FIG. 4;

FIGS. 6 to 8 are views of a semiconductor device according to an exemplary embodiment of the present inventive concept;

FIGS. 9 to 11 are cross sectional views of a semiconductor device according to an exemplary embodiment of the present inventive concept;

FIG. 12 is a cross sectional view of a semiconductor device according to an exemplary embodiment of the present inventive concept;

FIG. 13 is a cross sectional view of a semiconductor device according to an exemplary embodiment of the present inventive concept;

FIG. 14 is a perspective view of a semiconductor device according to an exemplary embodiment of the present inventive concept;

FIG. 15 is a cross sectional view taken along line A-A of FIG. 14;

FIG. 16 is a cross sectional view taken along line B-B of FIG. 10;

FIGS. 17 to 33 are views showing a method of fabricating a semiconductor device according to an exemplary embodiment of the present inventive concept;

FIG. 34 is a block diagram of an electronic system including a semiconductor device according to an exemplary embodiment of the present inventive concept; and FIGS. 35 and 36 illustrate semiconductor systems including a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinbelow, a semiconductor device according to an exemplary embodiment will be explained with reference to FIGS. 1 to 5.

FIG. 1 is a perspective view provided to explain a semiconductor device according to an exemplary embodiment, and FIG. 2 is a cross sectional view taken along line A-A of FIG. 1. FIG. 3 is a cross sectional view taken along line B-B of FIG. 1, and FIG. 4 is a cross sectional view taken along line C-C of FIG. 1. FIG. 5 illustrates only the gate spacer of FIG. 4; For convenience of explanation, FIG. 1 skips illustration of an interlayer insulating layer 180.

Referring to FIGS. 1 to 5, a semiconductor device 1 according to an exemplary embodiment may include a fin-type pattern 110, a first nanowire 120, a gate electrode 130, a gate spacer 140, a source/drain 150, etc.

The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The fin-type pattern 110 may be protruded from the substrate 100. A field insulating layer 105 may at least partially cover the sidewall of the fin-type pattern 110. The fin-type pattern 110 may be defined by the field insulating layer 105. The field insulating layer 105 may include, for example, one of oxide layer, nitride layer, oxynitride layer, or a combination thereof.

As illustrated in FIG. 1, the sidewall of the fin-type pattern 110 may be completely surrounded by the field insulating layer 105, but note that this is only for illustrative purpose, and embodiments are not limited thereto.

The fin-type pattern 110 may be elongated in a first direction X. For example, the fin-type pattern 110 may include a longer side extended in the first direction X, and a shorter side extended in a second direction Y.

The fin-type pattern 110 may be formed by partially etching the substrate 100, and may include an epitaxial layer grown on the substrate 100. The fin-type pattern 110 may include an element semiconductor material such as silicon or germanium, for example. Further, the fin-type pattern 110 may include a compound semiconductor such as, for example, IV-IV group compound semiconductor or III-V group compound semiconductor.

For example, take the IV-IV group compound semiconductor for instance, the fin-type pattern 110 may be a binary compound or a ternary compound including, for example, at least two or more of carbon (C), silicon (Si), germanium (Ge), and tin (Sn), or the above-mentioned binary or ternary compound doped with IV group element.

Take III-V group compound semiconductor for instance, the fin-type pattern 110 may be a binary compound, ternary compound or quaternary compound which is formed as a III group element which may be at least one of aluminum (Al), gallium (Ga), and indium (In), is combined with a V group element which may be one of phosphorus (P), arsenic (As) and antimony (Sb).

It is explained below that the fin-type pattern 110 of a semiconductor device according to embodiments includes silicon.

A first nanowire 120 may be formed on the substrate 100, while being spaced apart from the substrate 100. The first nanowire 120 may be extended in a first direction X.

For example, the first nanowire 120 may be formed on the fin-type pattern 110, while being spaced apart from the fin-type pattern 110. The first nanowire 120 may be overlapped with the fin-type pattern 110. The first nanowire 120 may be formed on the fin-type pattern 110, rather than being formed on the field insulating layer 105.

As illustrated in FIG. 3, the width of the first nanowire 120 in the second direction Y may be same as the width of the fin-type pattern 110 in the second direction Y, but note that this is only for convenience of explanation and embodiments are not limited thereto. Further, although it is illustrated that the first nanowire 120 has a square cross section, embodiments are not limited thereto. Of course, the corner of the first nanowire 120 may be rounded by appropriate process such as trimming.

The first nanowire 120 may be used as a channel region for the transistor. The first nanowire 120 may vary depending on whether the semiconductor device 1 is a PMOS or an NMOS, but embodiments are not limited thereto.

Further, the first nanowire 120 may include the same material as that of the fin-type pattern 110, or include a material different from that of the fin-type pattern 110. However, for convenience of explanation, it will be explained herein that the first nanowire 120 of the semiconductor device according to embodiments each includes silicon.

The gate electrode 130 may be formed on the field insulating layer 105 and the fin-type pattern 110. The gate electrode 130 may be extended in the second direction Y.

The gate electrode 130 may be so formed as to surround the periphery of the first nanowire 120 which is spaced from an upper surface of the fin-type pattern 110. The gate electrode 130 may also be formed in a space defined between the first nanowire 120 and the fin-type pattern 110.

The gate electrode 130 may include a conductive material. As illustrated, the gate electrode 130 may be a single layer, but not limited thereto. For example, the gate electrode 130 may include a work function conductive layer which adjusts work function, and a filling conductive layer which fills a space formed by the work function conductive layer for work function adjustment.

For example, the gate electrode 130 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the gate electrode 130 may each be formed of non-metal element such as Si or SiGe. For example, the gate electrode 130 described above may be formed by replacement process, but not limited thereto.

The gate spacer 140 may be formed on both sidewalls of the gate electrode 130 which is extended in the second direction Y. The gate spacer 140 may be formed on both sides of the first nanowire 120 facing each other. The gate spacer 140 may each include a through hole 140h.

The first nanowire 120 may be passed through the gate spacer 140. The first nanowire 120 may be passed through the through hole 140h. The gate spacer 140 may be in complete contact with a periphery of a portion of the side surface of the first nanowire 120.

When the corner of the first nanowire 120, which is surrounded by the gate electrode 130, is rounded by the process such as trimming, the portion of the side of the first nanowire 120 in contact with the gate spacer 140 may have a different cross section than a cross section of the first nanowire 120 surrounded by the gate electrode 130.

The gate spacer 140 may include an outer spacer 141 and an inner spacer 142. The outer spacer 141 may be in direct contact with the inner spacer 142. The inner spacer 142 may be disposed between the upper surface of the fin-type pattern 110 and the first nanowire 120, and may be in surface contact with the upper surface of the fin-type pattern 110. On a YZ cross section, the inner spacer 142 may be surrounded by the first nanowire 120, the first nanowire 120, and the outer spacer 141.

The through hole 140h of the gate spacer 140 may be defined by the outer spacer 141 and the inner spacer 142. An end of the first nanowire 120 may be in contact with the outer spacer 141 and the inner spacer 142.

Referring to FIG. 5, the through hole 140h may include first sides 140h-1 facing each other in the second direction Y, and second sides 140h-2 facing each other in a third direction Z. The second sides 140h-2 of the through hole 140h may connect the first sides 140h-1 of the through hole 140h which are facing each other.

In the semiconductor devices according to the embodiments, at least one of the second sides 140h-2 of the through hole 140h may be defined by the inner spacer 142. However, the first sides 140h-1 of the through hole 140h may be defined by the outer spacer 141.

For example, the through hole 140h may include three sides 140h-1, 140h-2 defined by the outer spacer 141, and one side 140h-2 defined by the inner spacer 142.

Herein, the first side 140h-1 of the through hole 140h may be defined by the outer spacer 141. Further, one of the second sides 140h-2 of the through hole 140h may be defined by the outer spacer 141, but the other of the second sides 140h-2 of the through hole 140h may be defined by the inner spacer 142.

The outer spacer 141 and the inner spacer 142 may include different materials from each other. When the material included in the outer spacer 141 has a first dielectric constant and the material included in the inner spacer 142 has a second dielectric constant, the first and the second dielectric constants may be different from each other.

In an exemplary embodiment, the material included in the outer spacer 141 may have a greater dielectric constant than the material included in the inner spacer 142. It is possible to reduce the fringing capacitance between the gate electrode 130 and the source/drain 150 by having the second dielectric constant smaller than the first dielectric constant.

For example, the outer spacer 141 may include at least one of silicon nitride (SiN), silicon oxynitride (SiON), silicon oxide (SiO$_2$), silicon oxycarbidenitride (SiOCN), and a combination thereof. For example, the inner spacer 142 may include at least one of a low-k dielectric material, silicon nitride (SiN), silicon oxynitride (SiON), silicon oxide (SiO$_2$), silicon oxycarbidenitride (SiOCN), and a combination thereof. The low-k dielectric material may be the material that has a smaller dielectric constant than the silicon oxide.

In another aspect, the gate spacer 140 may include a first region 140a and a second region 140b. The second region 140b of the gate spacer may be disposed on both sides in the second direction Y with respect to the first region 140a of the gate spacer in the middle.

The first region 140a of the gate spacer may be the region where the first nanowire 120 is passed through. The second region 140b of the gate spacer may be the region where the first nanowire 120 is not passed through. For example, the through hole 140h of the gate spacer 140 may be included in the first region 140a of the gate spacer.

The second region 140b of the gate spacer may include the outer spacer 141 only. Meanwhile, the first region 140a of the gate spacer may include the outer spacer 141 and the inner spacer 142. The first region 140a of the gate spacer may include an upper portion 140a-1 and a lower portion 140a-2.

For example, the upper portion 140a-1 of the first region 140a of the gate spacer may include a portion of the outer spacer 141, and the lower portion 140a-2 of the first region 140a of the gate spacer may include the inner spacer 142. For example, the lower portion 140a-2 of the first region of the gate spacer may include the inner spacer 142 only.

The height from the upper surface of the substrate 100 to the upper portion 140a-1 of the first region 140a of the gate spacer is greater than the height from the upper surface of the substrate 100 to the lower portion 140a-2 of the first region 140a of the gate spacer.

In the semiconductor devices according to the embodiments, at least one of the second sides 140h-2 of the through hole 140h may be defined by the lower portion 140a-2 of the second region of the gate spacer (i.e., the inner spacer 142). However, the first side 140h-1 of the through hole 140h may be defined by the upper portion 140a-1 of the first region of the gate spacer (i.e., the outer spacer 141).

The lower portion 140a-2 of the first region of the gate spacer may be in direct contact with the second region 140b of the gate spacer. Further, the second region 140b of the gate spacer and the upper portion 140a-1 of the first region of the gate spacer are included in the outer spacer 141. Accordingly, the second region 140b of the gate spacer and the upper portion 140a-1 of the first region of the gate spacer may be an integral structure.

In a semiconductor device according to an exemplary embodiment, there may not be an interposed layer between the uppermost portion of the first nanowire 120 and the outer spacer 141, at an overlapping portion with the gate spacer 140. In other words, the uppermost portion of the first nanowire 120 may be in contact with the upper portion 140a-1 of the first portion of the gate spacer.

Accordingly, at the first region 140a of the gate spacer, the lowermost portion of the first nanowire 120 may be in contact with the lower portion 140a-2 of the first region of the gate spacer, and the uppermost portion of the first nanowire 120 may be in contact with the upper portion 140a-1 of the first region of the gate spacer.

For example, at the first region 140a of the gate spacer, the lowermost portion of the first nanowire 120 may be in contact with the inner spacer 142, and the uppermost portion of the first nanowire 120 may be in contact with the outer spacer 141.

The gate insulating layer 147 may be formed between the first nanowire 120 and the gate electrode 130. Further, the gate insulating layer 147 may be formed between the field insulating layer 105 and the gate electrode 130, between the fin-type pattern 110 and the gate electrode 130, and between the gate spacer 140 and the gate electrode 130.

For example, the gate insulating layer 147 may include an interface layer 146 and a high-k insulating layer 145, but not limited thereto. For example, the interface layer 146 of the gate insulating layer 147 may be omitted depending on a material for the first nanowire 120.

Because the interface layer 146 may be formed on a periphery of the first nanowire 120, the interface layer 146 may be formed between the first nanowire 120 and the gate electrode 130, and between the fin-type pattern 110 and the gate electrode 130. Meanwhile, the high-k insulating layer 145 may be formed between the first nanowire 120 and the gate electrode 130, between the fin-type pattern 110 and the gate electrode 130, between the field insulating layer 105 and the gate electrode 130, and between the gate spacer 140 and the gate electrode 130.

The gate insulating layer 147 may be formed along the periphery of the first nanowire 120. The gate electrode 147 may be formed along the upper surface of the field insulating layer 105 and the upper surface of the fin-type pattern 110. Additionally, the gate insulating layer 147 may be formed along the sidewall of the gate spacer 140. For example, the gate insulating layer 147 may be formed along the sidewalls of the outer spacer 141 and the inner spacer 142.

When the first nanowire 120 includes silicon, the interface layer 146 may include silicon oxide layer. At this time, the interface layer 146 may be formed on the periphery of the first nanowire 120 and the upper surface of the fin-type pattern 110, but not formed along the sidewall of the gate spacer 140.

The high-k insulating layer 145 may include a high-k dielectric material having a higher dielectric constant than silicon oxide layer. For example, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

As described above, when the interface layer 146 is omitted, the high-k insulating layer 145 may include not only the high-k dielectric material, but also silicon oxide layer, silicon oxynitride layer, or silicon nitride layer.

Referring to FIGS. 1 and 2, the first nanowire 120 may be protruded farther to the first direction X than the gate insulating layer 147 formed on the sidewall of the gate electrode 130 (i.e., the high-k insulating layer 145). As described, the protruding end of the first nanowire 120 may be passed through the gate spacer 140 via the through hole 140h. The end of the first nanowire 120 may be passed through the gate spacer 140, and continue to be protruded farther than the outer sidewall of the gate spacer 140. For example, the end of the first nanowire 120 may be protruded farther than the outer sidewalls of the outer spacer 141 and the inner spacer 142.

As illustrated in FIG. 2, the gate spacer 140 may be formed on both sides of the gate electrode 130 with reference to the gate electrode 130, and the first nanowire 120 may be protruded farther from the outer sidewalls of both of the gate spacer 140 on both sides. For example, the first nanowire 120 may be protruded to both sides of the gate spacer 140. One end of the first nanowire 120 may be protruded farther than the gate spacer 140 on one side of the gate electrode 130 by a first distance d 1. Further, the other end of the first nanowire 120 may be protruded farther than the gate spacer 140 on the other side of the gate electrode 130 by a second distance d2. The first and the second distances d1, d2 may be equal to each other. However, embodiments are not limited to the example given above. Referring to FIG. 2, the inner spacer 142 and the outer spacer 141 are positioned on the same horizontal location with the same thickness to each other. Accordingly, the distance between the end of the first nanowire 120 and the outer sidewall of the inner spacer 142 may be equal to the distance between the end of the first nanowire 120 and the outer spacer 141.

The source/drain 150 may be formed on both sides of the gate electrode 130. The source/drain 150 may be formed on the fin-type pattern 110. The source/drain 150 may include an epitaxial layer formed on an upper surface of the fin-type pattern 110.

An outer circumference of the source/drain 150 may take on a variety of shapes. For example, the outer circumference of the source/drain 150 may be at least one of diamond, circle, rectangle, and octagon shapes. FIG. 1 illustrates a diamond shape (or pentagon or hexagon shape) for an example.

The source/drain 150 may be directly connected with the first nanowire 120 which is used as the channel region. For example, the source/drain 150 may be directly connected with the first nanowire 120 which is passed through the through hole 140h of the gate spacer 140. The first nanowire 120 may be protruded into the source/drain 150. For example, the source/drain 150 may have a groove to receive the protruded end portion of the first nanowire 120.

However, the source/drain 150 may not be in direct contact with the gate insulating layer 147. The gate spacer 140 may be located between the source/drain 150 and the gate insulating layer 147. For example, one sidewall of the inner spacer 142 may be in contact with the gate insulating layer 147, while the other sidewall of the inner spacer 142 may be in contact with the source/drain 150, in which case the source/drain 150 and the gate insulating layer 147 may not be contacted with each other between the first nanowire 120 and the substrate 100. Further, since the outer spacer 141 is in contact with the uppermost portion of the first nanowire 120, the source/drain 150 and the gate insulating layer 147 may not be contacted with each other over the first nanowire 120.

The semiconductor device 1 according to an exemplary embodiment may have facilitated epitaxial growth of the source/drain 150, because the first nanowire 120 is protruded farther than the gate spacer 140. This is because the source/drain 150 growth is facilitated, as there is a wider exposed area of the first nanowire 120. Further, because the exposure of the first nanowire 120 is facilitated, it is relatively easier to maintain the thickness of the inner spacer 142.

Hereinbelow, a semiconductor device according to another embodiment will be explained with reference to FIG. 1 and FIGS. 6 to 8. For convenience of explanation, differences that are not explained above with reference to FIGS. 1 to 5 will be mainly explained below.

FIGS. 6 to 8 are views provided to explain a semiconductor device according to another embodiment.

For reference, FIG. 6 is a cross sectional view taken along line A-A of FIG. 1. FIG. 7 is a cross sectional view taken along line C-C of FIG. 1. FIG. 8 illustrates only the gate spacer of FIG. 7.

Referring to FIGS. 6 to 8, in a semiconductor device 2 according to another embodiment, the lower portion 140*a*-2 of the first region of the gate spacer may include a plurality of insulating patterns which are spaced apart n a third direction Z.

Accordingly, the uppermost portion of the first nanowire 120 and the lowermost portion of the first nanowire 120 may be contacted with the lower portion 140*a*-2 of the first portion of the gate spacer.

The uppermost portion of the first nanowire 120 and the lowermost portion of the first nanowire 120 may be contacted with the inner spacer 142. In the first region 140*a* of the gate spacer, the inner spacer 142, having a material with a smaller dielectric constant than the outer spacer 141, is disposed over and under the first nanowire 120.

For example, the through hole 140*h* may include two sides 140*h*-1 defined by the outer spacer 141, and two sides 140*h*-2 defined by the inner spacer 142.

In a semiconductor device according to another embodiment, the first sides 140*h*-1 of the through hole 140*h* facing each other in the second direction Y may be defined by the outer spacer 141, and the second sides 140*h*-2 of the through hole 140*h* facing each other in the third direction Z may be defined by the inner spacer 142.

Hereinbelow, a semiconductor device according to yet another embodiment will be explained with reference to FIG. 1 and FIGS. 9 to 11. For convenience of explanation, differences that are not explained above with reference to FIGS. 1 to 5 will be mainly explained below.

FIGS. 9 to 11 are cross sectional views provided to explain a semiconductor device according to yet another embodiment.

For reference, FIG. 9 is a cross sectional view taken along line A-A of FIG. 1. FIG. 10 is a cross sectional view taken along line B-B of FIG. 1. FIG. 11 is a cross sectional view taken along line C-C of FIG. 1.

Referring to FIGS. 9 to 11, a semiconductor device 3 according to yet another embodiment may additionally include a second nanowire 125.

The second nanowire 125 may be formed on the substrate 100, while being spaced apart from the substrate 100. The second nanowire 125 may be extended in the first direction X.

The second nanowire 125 may be spaced from the substrate 100 farther than the first nanowire 120. For example, the height from the upper surface of the fin-type pattern 110 to the second nanowire 125 is greater than the height from the upper surface of the fin-type pattern 110 to the first nanowire 120.

The second nanowire 125 may be overlapped with the fin-type pattern 110. The second nanowire 125 may be formed on the fin-type pattern 110, rather than being formed on the field insulating layer 105.

The second nanowire 125 may be used as a channel region for the transistor. Accordingly, the second nanowire 125 may include the same material as the first nanowire 120.

The gate electrode 130 may be formed to surround the periphery of the first nanowire 125. The gate electrode 130 may be formed in the spacing between the first nanowire 120 and the second nanowire 125.

The gate spacer 140 may be disposed on both ends of the first nanowire 120 and on both ends of the second nanowire 125. The gate spacer 140 may each include a plurality of through holes 140*h*.

The second nanowire 125 may be passed through the gate spacer 140. The second nanowire 125 may be passed through one of the plurality of through holes 140*h*. The periphery of the end of the second nanowire 125 may be completely contacted with the gate spacer 140.

Like the first nanowire 120, when the corner of the second nanowire 125, which is surrounded by the gate electrode 130, is rounded by the process such as trimming, the end of the second nanowire 125 in contact with the gate spacer 140 may have a different cross section than a cross section of the second nanowire 125 surrounded by the gate electrode 130.

The gate spacer 140 may be formed on both sides of the gate electrode 130 with reference to the gate electrode 130, and the second nanowire 125 may be protruded farther from the sidewalls of both the gate spacer 140 on both sides. For example, the second nanowire 125 may be protruded to both sides of the gate spacer 140. One end of the second nanowire 125 may be protruded farther than the gate spacer 140 on one side of the gate electrode 130 by a first distance d 1. Further, the other end of the second nanowire 125 may be protruded farther than the gate spacer 140 on the other side of the gate electrode 130 by a second distance d2. The first and the second distances d1, d2 may be equal to each other. However, embodiments are not limited to the example given above. Referring to FIG. 2, the inner spacer 142 and the outer spacer 141 are positioned on the same horizontal location with the same thickness to each other. Accordingly, the distance between the end of the second nanowire 125 and the outer sidewall of the inner spacer 142 may be equal to the distance between the end of the second nanowire 125 and the outer spacer 141.

The second nanowire 125 may be aligned with the first nanowire 120. The second nanowire 125 may be overlapped with the first nanowire 120 in the third direction Z. The first and second nanowires 120, 125 may have equal length to each other. However, embodiments are not limited to the example given above. Further, the first and second nanowires 120, 125 may be aligned in the third direction Z, to be protruded to the same distances d1, d2 from the gate spacer 140.

The inner spacer 142 may be disposed between the upper surface of the fin-type pattern 110 and the first nanowire 120, and between the first nanowire 120 and the second nanowire 125. For example, the inner spacer 142 may include a plurality of insulating patterns spaced apart from each other in the third direction Z.

Referring to FIG. 9, the uppermost surface of the second nanowire 125 may be in contact with the outer spacer 141 and the lowermost surface of the second nanowire 125 may be in contact with the inner spacer 142, although embodiments are not limited thereto. For example, as illustrated in FIG. 6, the uppermost surface of the second nanowire 125 and the lowermost surface of the second nanowire 125 may be in contact with the inner spacer 142, respectively.

The gate insulating layer 147 may be formed between the second nanowire 125 and the gate electrode 130. The gate insulating layer 147 may be formed along the periphery of the second nanowire 125.

The source/drain 150 may be directly connected with the second nanowire 125 which is used as the channel region. For example, the source/drain 150 may be directly connected with the first nanowire 120 and the second nanowire 125 which are passed through the through hole 140h of the gate spacer 140.

Hereinbelow, a semiconductor device 4 according to an exemplary embodiment will be explained with reference to FIGS. 1 to 12. For convenience of explanation, differences that are not explained above with reference to FIGS. 1 to 5 will be mainly explained below.

FIG. 12 is a cross sectional view provided to explain a semiconductor device according to yet another embodiment. FIG. 12 is a cross sectional view taken along line A-A of FIG. 1.

Referring to FIG. 12, the thickness of the outer spacer 141 may be different from the thickness of the inner spacer 142. For example, the thickness W1 of the outer spacer 141 may be smaller than the thickness W2 of the inner spacer 142. The thickness W2 of the inner spacer 142 may be so determined that the first nanowire 120 is protruded farther than the outer sidewall of the inner spacer 142. It is possible to relatively reinforce the insulation of the gate electrode 130 and the source/drain 150 overlapped with the inner spacer 142, by relatively increasing the thickness W2 of the inner spacer 142.

Hereinbelow, a semiconductor device 5 according to an exemplary embodiment will be explained with reference to FIGS. 1 to 13. For convenience of explanation, differences that are not explained above with reference to FIGS. 1 to 5 will be mainly explained below.

FIG. 13 is a cross sectional view provided to explain a semiconductor device according to yet another embodiment. FIG. 13 is a cross sectional view taken along line A-A of FIG. 1.

Referring to FIG. 13, the thickness of the outer spacer 141 may be different from the thickness of the inner spacer 142. For example, the thickness W1 of the outer spacer 141 may be greater than the thickness W3 of the inner spacer 142. The thickness W3 of the inner spacer 142 may be relatively smaller so that the area of exposing the first nanowire 120 is increased. Accordingly, the yields of the semiconductor device 5 according to an exemplary embodiment can be enhanced.

Hereinbelow, a semiconductor device according to yet another embodiment will be explained with reference to FIGS. 14 to 16. For convenience of explanation, differences that are not explained above with reference to FIGS. 1 to 5 will be mainly explained below.

FIG. 14 is a perspective view provided to explain a semiconductor device according to yet another embodiment, and FIG. 15 is a cross sectional view taken along line A-A of FIG. 14. FIG. 16 is a cross sectional view taken along line B-B of FIG. 10.

Referring to FIGS. 14 to 16, a semiconductor device 6 according to yet another embodiment may include a substrate 100, a base substrate 102, and a buried insulating layer 103 formed on the base substrate 102.

The base substrate 102 may include the same material as the substrate 100 described above. The buried insulating layer 103 may cover the upper surface of the base substrate 102. The buried insulating layer 103 may include an insulating material, such as, for example, one of oxide layer, nitride layer, oxynitride layer, and a combination thereof.

In the semiconductor device 4 according to yet another embodiment, a fin-type pattern protruded from the substrate 100 may not be formed.

The first nanowire 120 may be formed on the buried substrate 103, while being spaced apart from the substrate 100. The gate electrode 130 may be formed on the buried insulating layer 103, covering the first nanowire 120.

The inner spacer 142 of the gate spacer 140 may be disposed between the first nanowire 120 and the substrate 100. In the semiconductor device 6 according to yet another embodiment, the inner spacer 142 may be in contact with the buried insulating layer 103.

The interface layer 146 of the gate insulating layer 147 may be formed along the periphery of the first nanowire 120, but may not be formed along the upper surface of the buried insulating layer 103. However, the high-k insulating layer 145 may be formed along not only the periphery of the first nanowire 120, but also the upper surface of the buried insulating layer 103.

Hereinbelow, a method of fabricating a semiconductor device according to an exemplary embodiment will be explained with reference to FIGS. 17 to 33. The semiconductor device fabricated based on FIGS. 17 to 33 corresponds to the semiconductor device 2 described above with reference to FIGS. 6.

FIGS. 17 to 33 show a method of fabricating a semiconductor device according to an exemplary embodiment. For reference, FIG. 30 is a cross sectional view taken along line D-D of FIG. 29, and FIG. 31 is a cross sectional view taken along line E-E of FIG. 29.

Referring to FIG. 17, a first sacrificial layer 2001, an active layer 2002, and a second sacrificial layer 2003 are formed sequentially on the substrate 100.

The first sacrificial layer 2001 and the second sacrificial layer 2003 may include the same material, and the first sacrificial layer 2001 and the active layer 2002 may include different materials. For the convenience of description, it is assumed that the first sacrificial layer 2001 and the second sacrificial layer 2003 include the same material. Further, the active layer 2002 may include a material with etch selectivity with respect to the first sacrificial layer 2001.

For example, the substrate 100 and the active layer 2002 may include a material to be used as a channel region of a transistor. For example, in the case of PMOS, the active layer 2002 may include a material providing holes, while in the case of NMOS, the active layer 2002 may include a material providing electrons.

The first sacrificial layer 2001 and the second sacrificial layer 2003 may include a material having a similar lattice constant and lattice structure as the active layer 2002. For example, the first sacrificial layer 2001 and the second sacrificial layer 2003 may be a semiconductor material, or a crystallized metal material.

For the convenience of description, it is assumed that the active layer 2002 includes silicon, and the first sacrificial layer 2001 and the second sacrificial layer 2003 each include silicon germanium.

FIG. 17 illustrates only one active layer 2002, but this is only for illustrative purpose, and the present inventive concept is not limited thereto. Accordingly, there may be plural pairs of the first sacrificial layer 2001 and the active layer 2002 formed in turn, with the second sacrificial layer 2003 being formed on the uppermost active layer 2002.

Further, although FIG. 17 illustrates the second sacrificial layer 2003 being positioned on the uppermost portion of the stack layer structure, the present inventive concept is not limited thereto. For example, the active layer 2002 may be on the uppermost portion of the stack layer structure.

Next, a first mask pattern 2103 is formed on the second sacrificial layer 2003. The first mask pattern 2103 may be elongated in a first direction X.

For example, the first mask pattern 2103 may be formed of at least one of silicon oxide, silicon nitride, and silicon oxynitride.

Referring to FIG. 18, an etching process is conducted using the first mask pattern 2103 as an etch mask, thus forming a fin-type structure 110P.

The fin-type structure 110P may be formed by patterning a portion of the second sacrificial layer 2003, the active layer 2002, the first sacrificial layer 2001, and the substrate 100.

The fin-type structure 110P may be formed on the substrate 100 and protruded from the substrate 100. The fin-type structure 110P may be extended in the first direction X, as in the case of the first mask pattern 2103.

The fin-type structure 110P may include a fin-type pattern 110, a first sacrificial pattern 121, a pre-nanowire 122, and a second sacrificial pattern 123 which are stacked sequentially on the substrate 100.

Referring to FIG. 19, a field insulating layer 105, covering at least a portion of the sidewall of the fin-type structure 110P, may be formed on the substrate 100.

For example, the field insulating layer 105 covering the fin-type structure 110P is formed on the substrate 100. With the planarization process of the field insulating layer 105, the upper surface of the fin-type structure 110P and the upper surface of the field insulating layer 105 may be placed on the same plane.

The first mask pattern 2103 may be removed in the process of the planarization, but the present inventive concept is not limited thereto.

The upper portion of the field insulating layer 105 is then recessed, thus exposing a portion of the fin-type structure 110P. The recess process may include an etching process. For example, the fin-type structure 110P may be formed, protruding on the field insulating layer 105.

Referring to FIG. 19, the second sacrificial pattern 123, the pre-nanowire 122 and the first sacrificial pattern 121 may be protruded on the upper surface of the field insulating layer 105, and the sidewall of the fin-type pattern 110 may be completely surrounded by the field insulating layer 105, but the present inventive concept is not limited thereto. For example, a portion of the sidewall of the fin-type pattern 110 may be protruded on the upper surface of the field insulating layer 105 through the recessing process of the upper portion of the field insulating layer 105.

The pre-nanowire 122 may be doped with impurities for the purpose of threshold voltage adjustment, before and/or after the recessing process which causes the portion of the fin-type structure 110P to be protruded beyond the upper surface of the field insulating layer 105. When the semiconductor device 1-6 is an NMOS transistor, the impurities may be boron (B). When the semiconductor device 1-6 is a PMOS transistor, the impurities may be phosphorus (P) or arsenic (As), but the present inventive concept is not limited thereto.

Referring to FIG. 20, a dummy gate pattern 135 may be formed, which is extended across the fin-type structure 110P in the second direction Y, by performing an etching process with the second mask pattern 2104. The dummy gate pattern 135 may be formed on the fin-type structure 110P.

The dummy gate pattern 135 may include a dummy gate insulating layer 136 and a dummy gate electrode 137. For example, the dummy gate insulating layer 136 may include a silicon oxide layer, and the dummy gate electrode 137 may include polysilicon or amorphous silicon.

Referring to FIG. 21, the outer spacer 141 may be formed on the sidewall of the dummy gate pattern 135. For example, the outer spacer 141 may be formed on the sidewall of the dummy gate insulating layer 136 and on the sidewall of the dummy gate electrode 137.

For example, a first spacer layer is formed on the field insulating layer 105, covering the dummy gate pattern 135 and the fin-type structure 110P. The first spacer layer is then etched-back, thus leaving the outer spacer 141 on the sidewall of the dummy gate pattern 135.

Referring to FIG. 22, a sacrificial spacer 143 may be formed on the sidewall of the outer spacer 141. The sacrificial spacer 143 may be formed on the sidewall of the outer spacer 141. The outer spacer 141 and the sacrificial spacer 143 may form dual spacer layers.

For example, the sacrificial spacer layer is formed on the field insulating layer 105, covering the dummy gate pattern 135, the fin-type structure 110P and the outer spacer 141. The sacrificial spacer layer may then be etched-back, thus leaving the sacrificial spacer 143 on the sidewall of the dummy gate pattern 135.

Referring to FIGS. 21 and 22, the sacrificial spacer 143 may be formed after the outer spacer 141 is formed, but the present inventive concept is not limited thereto. For example, after formation of the first spacer layer and then the formation of the sacrificial spacer layer, the outer spacer 141 and the sacrificial spacer 143 may be formed by etching-back the first spacer layer and the sacrificial spacer layer at once. In this case, the lower portion of the outer spacer 141 may be in an "L" shape.

Referring to FIG. 23, the fin-type structure 110P, which is not overlapped with the dummy gate electrode 137, the outer spacer 141 and the sacrificial spacer 143, is removed, using the dummy gate pattern 135 including the dummy gate electrode 137 as a mask. By doing so, a recess 150r may be formed within the fin-type structure 110P. The recess 150r may expose the fin-type pattern 110. For example, the recess 150r may expose a top surface of the fin-type pattern 110.

Formation of the outer spacer 141 and the sacrificial spacer 143 may be concurrently performed with formation of the recess 150r, but the present inventive concept is not limited thereto. For example, the recess 150r may be formed by removing a portion of the fin-type structure 110P, after the outer spacer 141 and the sacrificial spacer 143 are formed.

While the recess 150r is formed in the fin-type structure 110P, the first sacrificial pattern 121 and the second sacrificial pattern 123 not overlapped with the dummy gate electrode 137, the outer spacer 141 and the sacrificial spacer 143 may be removed. Further, while the recess 150r is formed in the fin-type structure 110P, the pre-nanowire 122 that is not overlapped with the dummy gate electrode 137, the outer spacer 141 and the sacrificial spacer 143 is removed so that the first nanowire 120 is formed.

The recess 150r may expose the cross section of the first sacrificial pattern 121, the cross section of the second sacrificial pattern 123, and the cross section of the first nanowire 120.

Referring to FIG. 24, at least a portion of the first sacrificial pattern 121 and at least a portion of the second sacrificial pattern 123, which are exposed by the recess 150r and overlapped with the outer spacer 141 and the sacrificial spacer 143, may be removed. As a result, a dimple 142r may be formed among the sacrificial spacer 143, the outer spacer 141 and the first nanowire 120.

The dimples 142r may be a recessed region recessed in the first direction X from the recess 150r to the dummy gate pattern 135.

For example, the dimple 142r may be formed by using a selective etching process. For example, the dimple 142r may be formed by the etching process using an etchant with a higher etch rate for the first sacrificial pattern 121 and the second sacrificial pattern 123, compared to the etch rate for the first nanowire 120.

Referring to FIG. 25, the inner spacer 142 may be formed by filling in the dimple 142r with an insulating material.

For example, a second spacer layer may be formed, filling the dimple 142r. The second spacer layer may be a material with a good gap-filling capability. The second spacer layer may also be formed on the field insulating layer 105, the sidewall of the sacrificial spacer 143, and the dummy gate pattern 135.

An etching process may then be performed, etching the second spacer layer until the upper surface of the fin-type pattern 110, which is not overlapped with the dummy gate pattern 135 and the sacrificial spacer 143, is exposed. As a result, the inner spacer 142 may be formed. In an exemplary embodiment, the outer spacer 141 may also be exposed in the etching process to form the inner spacer 142. The remaining second spacer within the dimple 142r after the etching process may be referred to as the inner spacer 142.

In the etching process, the thickness of the inner spacer 142 may be controlled for the first nanowire 120 to protrude from the inner spacer 142. For example, the thickness of the inner spacer 142 may be equal to the thickness of the outer spacer 141. However, the present inventive concept is not limited thereto. The thickness of the inner spacer 142 may be different from the thickness of the outer spacer 141. In an exemplary embodiment, the thickness of the inner spacer 122 may be greater than the thickness of the outer spacer 141 and smaller than the sum of the thicknesses of the outer spacer 141 and the sacrificial spacer 143. In an exemplary embodiment, the thickness of the inner spacer 122 may be smaller than the thickness of the outer spacer 141.

For example, if the thickness of the inner spacer 142 is greater than the thickness of the outer spacer 141, the gate electrode 130 and the source/drain (to be formed later) may have enhanced insulating properties. On the contrary, if the thickness of the inner spacer 142 is smaller than the thickness of the outer spacer 141, the area of exposure of the first nanowire 120 may increase so that the source/drain (to be formed later) has increased yield of epitaxial growth.

Accordingly, the gate spacer 140 including the outer spacer 141 and the inner spacer 142 may be formed.

Referring to FIG. 26, the sacrificial spacer 143 may be removed. A through hole 140h, defined by the outer spacer 141 and the inner spacer 142, may be formed in the gate spacer 140. The first nanowire 120 may be exposed through the through hole 140h. For example, the first nanowire 120 may be passed through the through hole 140h.

Upon removal of the sacrificial spacer 143, a portion of the outer spacer 141 and the first nanowire 120 may be exposed. The step of forming the inner spacer 142 and the step of removing the sacrificial spacer 143 are explained separately from each other with reference to FIGS. 25 and 26, but the present inventive concept is not limited thereto. For example, if the inner spacer 142 and the sacrificial spacer 143 are formed of a same material, the step of forming the inner spacer 142 and the process of removing the sacrificial spacer 143 may be carried out concurrently. In this case, the thickness of the inner spacer 142 may be substantially identical to the thickness of the outer spacer 141.

Upon removal of the sacrificial spacer 143, an end portion of the first nanowire 120 protruded beyond the inner spacer 142 and the outer spacer 141 may be formed. Such protruded end portion of the first nanowire 120 may increase the efficiency in the source/drain epitaxial growth step which will be performed later.

Referring to FIG. 27, a source/drain 150 for filling the recess 150r may be formed. The source/drain 150 may be formed on both sides of the dummy gate pattern 135.

The source/drain 150 may be formed on the exposed fin-type pattern 110 and the first nanowire 120. The exposed fin-type pattern 110 and the first nanowire 120 may serve as the seed layer in the formation of the source/drain 150. The present inventive concept is not limited thereto. For example, a seed layer may be formed on the protruding cross section of the first nanowire 120 and the fin-type pattern 110, which are exposed by the recess 150r.

The source/drain 150 may be formed, covering the inner spacer 142. The source/drain 150 may contact the inner spacer 142.

The source/drain 150 may be formed using an epitaxial process. Depending on whether a semiconductor device to be formed is an n-type transistor or a p-type transistor, impurities doped in the epitaxial layer of the source/drain 150 may vary. In an exemplary embodiment, impurities may be doped in situ during an epitaxial process.

Referring to FIG. 28, an interlayer insulating layer 180 may be formed on the field insulating layer 105, covering the source/drain 150, the gate spacer 140, the dummy gate pattern 135, and so on.

The interlayer insulating layer 180 may include at least one of low-k dielectric material, oxide, nitride and oxynitride. For example, the low-k dielectric material may be flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof.

The interlayer insulating layer 180 is then planarized until the upper surface of the dummy gate electrode 137 is exposed. As a result, the second mask pattern 2104 is removed, exposing the upper surface of the dummy gate electrode 137.

Referring to FIGS. 29 to 31, removed may be the dummy gate pattern 135 including the dummy gate insulating layer 136 and the dummy gate electrode 137.

With the removal of the dummy gate insulating layer 136 and the dummy gate electrode 137, the field insulating layer 105 and the fin-type structure 110P overlapped with the dummy gate pattern 135 may be exposed. For example, the first sacrificial pattern 121, the second sacrificial pattern 123 and the first nanowire 120 overlapped with the dummy gate pattern 135 may now be exposed.

Referring to FIGS. 32 and 33, the first sacrificial pattern 121 and the second sacrificial pattern 123 may be removed from the fin-type structure 110P, and the first nanowire 120 may remain in the fin-type structure 110P.

As a result, a space may be formed between the first nanowire 120 and the fin-type pattern 100, and the first nanowire 120 may be formed over the fin-type pattern 110.

Removing the first sacrificial pattern 121 and the second sacrificial pattern 123 over and under the first nanowire 120 may be performed by, for example, an etching process. For example, etch selectivity of the first sacrificial pattern 121 and the second sacrificial pattern 123 with respect to the first nanowire 120 may be utilized.

Additionally, the removal of the first sacrificial pattern 121 and the second sacrificial pattern 123 may allow the inner spacer 142 of the gate spacer 140 to be exposed.

Referring back to FIG. 6, an interface layer 146 may be formed on a periphery of the first nanowire 120 and the upper surface of the fin-type pattern 110.

The high-k insulating layer 145 may then be formed on the sidewall of the gate spacer 140, i.e., on sidewalls of the outer spacer 141 and the inner spacer 142, and along the periphery of the first nanowire 120. The high-k insulating layer 145 may be in contact with the inner spacer 142. Accordingly, the gate insulating layer 147 including the interface layer 146 and the high-k insulating layer 145 may be formed.

Next, the gate electrode 130 may be formed, which surrounds the first nanowire 120 and which is extended in the second direction Y. The gate electrode 130 may be a replacement metal gate electrode.

FIG. 34 is a block diagram of an electronic system comprising a semiconductor device according to several embodiments.

Referring to FIG. 34, an electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled to one another via the bus 1150. The bus 1150 corresponds to a path through which data travels.

The controller 1110 may include at least one of a microprocessor, a digital signal processor, a micro controller and an logic device capable of performing functions similar to those mentioned above. The I/O device 1120 may include a keypad, a keyboard or a display device. The memory device 1130 may store data and/or commands. The interface 1140 may perform a function of transmitting data to communication networks or receiving data from the communication networks. The interface 1140 may be wired or wireless. For example, the interface 1140 may include an antenna or a wired/wireless transceiver. Although not illustrated, the electronic system 1100 may additionally include an operation memory to enhance operation of the controller 1110, such as a high-speed dynamic random access memory (DRAM) and/or a static random access memory (SRAM). In an exemplary embodiment, a semiconductor device fabricated according to an exemplary embodiment may be provided within the memory device 1130, or provided as a part of the controller 1110, or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

FIGS. 35 and 36 illustrate exemplary semiconductor systems including a semiconductor device fabricated according to an exemplary embodiment. FIG. 35 illustrates a tablet PC and FIG. 36 illustrates a laptop computer. A semiconductor device according to an exemplary embodiment may be used in the tablet PC or the laptop computer. A semiconductor device according to an exemplary embodiment may be applicable to an integrated circuit device not illustrated herein.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a first nanowire disposed on a substrate,
   wherein the first nanowire is extended in a first direction and spaced apart from the substrate;
   a gate electrode surrounding a periphery of the first nanowire, wherein the gate electrode is extended in a second direction intersecting the first direction;
   a gate spacer formed on a sidewall of the gate electrode,
   the gate spacer comprising an inner sidewall and an outer sidewall facing each other,
   wherein the inner sidewall of the gate spacer faces the sidewall of the gate electrode and an end portion of the first nanowire is protruded from the outer sidewall of the gate spacer; and
   a source/drain epitaxial layer disposed on at least one side of the gate electrode, wherein the source/drain epitaxial layer is connected to the end portion of the first nanowire,
   wherein the gate spacer comprises an inner spacer and an outer spacer surrounding the inner spacer in a cross-section taken along the second direction,
   wherein the inner spacer is located between the substrate and the first nanowire,
   wherein the inner spacer includes a sidewall extending in the first direction,
   wherein the outer spacer covers the sidewall of the inner spacer and is in contact with the sidewall of the inner spacer, and
   wherein the first nanowire is in contact with the outer spacer and the inner spacer.

2. The semiconductor device of claim 1,
   wherein the first nanowire is disposed between the outer spacer and the inner spacer in the cross-section.

3. The semiconductor device of claim 1,
   wherein the inner spacer and the outer spacer have different dielectric constants from each other.

4. The semiconductor device of claim 3,
   wherein the dielectric constant of the inner spacer is smaller than that of the outer spacer.

5. The semiconductor device of claim 1,
wherein a top surface of the first nanowire is in contact with the outer spacer, and
a bottom surface of the first nanowire is in contact with the inner spacer.

6. The semiconductor device of claim 1,
wherein thicknesses of the inner spacer and the outer spacer are different from each other.

7. The semiconductor device of claim 6,
wherein the thickness of the inner spacer is greater than the thickness of the outer spacer.

8. The semiconductor device of claim 1, further comprising:
a second nanowire disposed on the substrate and extended in the first direction, wherein the first nanowire is interposed between the second nanowire and the substrate, and a periphery of the second nanowire is surrounded by the gate electrode.

9. The semiconductor device of claim 8,
wherein the gate spacer comprises an inner spacer and an outer spacer surrounding the inner spacer in a cross-section taken along the second direction, and
wherein the inner spacer is located between the substrate and the first nanowire, and between the first nanowire and the second nanowire in the cross-section.

10. The semiconductor device of claim 1,
wherein the outer sidewall of the gate spacer includes a sidewall of the inner spacer and a sidewall of the outer spacer, and
wherein the sidewall of the inner spacer and the sidewall of the outer spacer are aligned to each other to form the outer sidewall of the gate spacer.

11. A semiconductor device, comprising:
a gate electrode disposed on a substrate and extended in a first direction;
an inner spacer formed on the substrate and a first portion of a sidewall of the gate electrode;
an outer spacer formed on a second portion of the sidewall of the gate electrode,
wherein the second portion of the sidewall of the gate electrode surrounds the first portion of the sidewall of the gate electrode;
a first nanowire disposed on the substrate,
wherein the first nanowire is extended in a second direction which is different from the first direction and an end portion of the first nanowire is protruded from the inner spacer and the outer spacer; and
a source/drain connected with the end portion of the first nanowire,
wherein the inner spacer is located between the substrate and the first nanowire,
wherein the inner spacer includes a sidewall extending in the first direction,
wherein the outer spacer covers the sidewall of the inner spacer and is in contact with the sidewall of the inner spacer, and
wherein the first nanowire is in contact with the outer spacer and the inner spacer.

12. The semiconductor device of claim 11,
wherein the inner spacer and the outer spacer have different dielectric constants from each other.

13. The semiconductor device of claim 11,
wherein thicknesses of the inner spacer and the outer spacer are different from each other.

14. The semiconductor device of claim 11,
wherein the first nanowire passes through the gate electrode in the second direction.

15. The semiconductor device of claim 11, further comprising:
a second nanowire disposed on the substrate,
wherein the first nanowire is interposed between the second nanowire and the substrate, and
wherein the second nanowire passes through the gate electrode in the second direction.

16. A semiconductor device, comprising:
a plurality of nanowires disposed on a substrate,
wherein each of the plurality of nanowires is extended in a first direction and spaced apart from the substrate;
a gate electrode surrounding a periphery of each of the plurality of nanowires,
wherein the gate electrode is extended in a second direction intersecting the first direction;
a gate spacer formed on a sidewall of the gate electrode,
the gate spacer comprising an inner sidewall and an outer sidewall facing each other,
wherein the inner sidewall of the gate spacer faces the sidewall of the gate electrode and an end portion of each of the plurality of nanowires is protruded from the outer sidewall of the gate spacer; and
a source/drain epitaxial layer disposed on at least one side of the gate electrode,
wherein the source/drain epitaxial layer is connected to the end portion of each of the plurality of nanowires,
wherein the gate spacer comprises an inner spacer and an outer spacer surrounding the inner spacer in a cross-section taken along the second direction,
wherein the inner spacer is located between the substrate and each of the plurality of nanowires,
wherein the inner spacer includes a sidewall extending in the first direction,
wherein the outer spacer covers the sidewall of the inner spacer and is in contact with the sidewall of the inner spacer, and
wherein each of the plurality of nanowires is in contact with the outer spacer and the inner spacer.

17. The semiconductor device of claim 16,
wherein the plurality of nanowires comprises a first nanowire spaced apart a first distance from the substrate and a second nanowire spaced apart a second distance that greater than the first distance from the substrate.

18. The semiconductor device of claim 17,
wherein the first nanowire and the second nanowire are overlapped vertically.

* * * * *